United States Patent [19]

Horikawa et al.

[11] Patent Number: 6,015,989
[45] Date of Patent: *Jan. 18, 2000

[54] SEMICONDUCTOR DEVICE HAVING A CAPACITOR ELECTRODE FORMED OF IRIDUM OR RUTHENIUM AND A QUANTITY OF OXYGEN

[75] Inventors: Tsuyosi Horikawa; Tetsuro Makita; Takeharu Kuroiwa; Noboru Mikami; Teruo Shibano, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/770,510

[22] Filed: Dec. 20, 1996

[30] Foreign Application Priority Data

Jun. 28, 1996  [JP]  Japan ................... P 8-169761

[51] Int. Cl.[7] .............. H01L 27/108; H01L 29/76; H01L 29/94; H01L 31/119
[52] U.S. Cl. .............. 257/309; 257/303; 257/310; 257/311; 257/535
[58] Field of Search .................... 257/303, 306, 257/309, 310, 311, 535

[56] References Cited

U.S. PATENT DOCUMENTS

| | | | |
|---|---|---|---|
| 4,851,895 | 7/1989 | Green et al. ............ | 257/751 |
| 4,982,309 | 1/1991 | Shepherd ............... | 361/321 |
| 5,122,923 | 6/1992 | Matsubara et al. ...... | 361/321 |
| 5,210,043 | 5/1993 | Hosaka .................. | 437/30 |
| 5,335,138 | 8/1994 | Sandhu et al. .......... | 361/303 |
| 5,609,927 | 3/1997 | Summerfelt et al. ..... | 427/553 |
| 5,612,574 | 3/1997 | Summerfelt et al. ..... | 257/783 |

FOREIGN PATENT DOCUMENTS

| | | |
|---|---|---|
| 387055 | 4/1991 | Japan . |
| 3257858 | 11/1991 | Japan . |

*Primary Examiner*—Olik Chaudhuri
*Assistant Examiner*—Howard Weiss
*Attorney, Agent, or Firm*—Birch, Stewart, Kolasch & Birch, LLP

[57] ABSTRACT

A semiconductor device includes a semiconductor substrate having a major surface; a first interlayer insulating film formed on the semiconductor substrate and having an opening defined therein so as to open at the major surface of the semiconductor substrate; a connecting member made of Si as a principal component and embedded in the opening; a lower capacitor electrode connected electrically with the major surface of the semiconductor substrate through the connecting member; a capacitor dielectric film formed on the lower capacitor electrode; an upper capacitor electrode formed on the capacitor dielectric film; and a second interlayer insulating film formed on the capacitor upper electrode. The lower capacitor electrode referred to above is made of a principal component selected from the group consisting of ruthenium and iridium and contains oxygen in a quantity of 0.001 to 0.1% by atom and/or at least one impurity element in a quantity of 0.1 to 5% by atom. The impurity element is selected from the group consisting of titanium, chrome, tungsten, cobalt, palladium and molybdenum.

6 Claims, 22 Drawing Sheets

○ Leak current after the flattening annealing
□ Contact resistance after the flattening annealing Heat treatment oxygen partial pressure = 5mTorr
Heat treatment time = 5min Heat treatmet oxygen partial pressure = 5mTorr

SEMICONDUCTOR DEVICE HAVING A CAPACITOR ELECTRODE FORMED OF IRIDUM OR RUTHENIUM AND A QUANTITY OF OXYGEN

BACKGROUND OF THE INVENTION

1. Field of the Invention

The present invention relates to a semiconductor apparatus and a method of manufacturing the same and, more particularly, to construction of a DRAM (Dynamic Random Access Memory) utilizing heat-resistant capacitor cells and a method of manufacturing the DRAM.

2. Description of the Prior Art

In a highly integrated semiconductor device such as, for example, a 256 M-bit DRAM or the like, a high dielectric material such as PZT (titanic acid zircon acid lead) or the like is used for the capacitor dielectric film, in addition to the use of the stacked capacitor construction of a multilayered structure, in an attempt to reduce the size of a capacitor to thereby increase the integration density of elements.

The prior art DRAM is shown in FIG. 21 in a partial sectional view.

Referring to FIG. 21, the major surface of a P-type semiconductor substrate 101 has a field oxide film 102 separated from other elements to leave an activation region on the major surface of the substrate 101 where N-type impurity regions 106a, 106b and 106c which eventually form source-drain regions, are formed. Transfer gate transistors 103a and 103b, each having a gate electrode 104a or 104b formed on a corresponding channel region 121 with a gate insulating film 105 intervening therebetween, are formed between the neighboring members of the impurity regions.

On the other hand, a gate electrode 104d of the other transfer gate transistor extends onto the field oxide film 102, and an oxide film 107 is formed so as to overlay the gate electrodes 104b, 104c and 104d.

An embedded bit wire 108 connected electrically with the impurity region 106a is formed on the impurity region 106a, which wire 108 is in turn covered by an insulating layer 109.

Also, to cover the insulating film 109 and the oxide film 107, a first interlayer insulating film 110 having its top face flattened. A contact hole 110a is defined in a portion of the first interlayer insulating film 110 immediately above the impurity region 106b, and a connecting member (plug) 111 containing Si as a principal component and electrically connected with the impurity region 106b is embedded within the contact hole 110a.

A lower capacitor electrode 130 made of platinum is formed in an electrically connected fashion on an upper surface of the connecting member 111 through a diffusion preventing film 129. Further, a capacitor dielectric film 115 made of PZT, SrTiO$_3$ or the like, and an upper capacitor electrode 116 made of platinum are deposited one above the other so as to overlay the lower capacitor electrode 114.

Further, a second interlayer insulating film 117 is deposited on an upper capacitor electrode 116 so as to cover the latter and has its top face flattened. First aluminum wiring layers 118 are formed on the flat top surface of the second interlayer insulating film 117 and spaced a distance from each other, and are covered by a protective film 119 which is in turn covered by a second aluminum wiring layer 120.

The prior art DRAM of the structure described above has an advantage in that since the lower capacitor electrode 130 is made of platinum, the lower capacitor electrode 130 does hardly react with the capacitor dielectric film 115 with no reaction layer substantially formed at the interface between the capacitor electrode 130 and the capacitor dielectric film 115. However, because of inferior reactivity and difficulty in machining, difficulty has been encountered in highly integrating the DRAM which requires a microfabricating technique.

Also, to prevent Si in the connecting member 111 from being diffused within the platinum electrode, the diffusion preventing film 129 has been necessitated beneath the platinum electrode 130.

On the other hand, it has been suggested to use an easily workable ruthenium or iridium as material for the lower capacitor electrode 130, but the use of ruthenium or iridium would bring about the following problems because of higher reactivity than that of the platinum.

Namely, ruthenium or the like had a first problem in that silicide tends to be formed through reaction with Si in the connecting member (plug) 111 provided in the lower portion of the lower capacitor electrode 130, accompanied by deformation in shape of the lower capacitor electrode 130 to such an extent as to result in increase the capacitor leak current, when it is exposed to a high temperature during a heat treatment such as annealing employed to flatten the interlayer insulating film.

Also, when ruthenium or iridium is used for the lower capacitor electrode 130 and/or the capacitor upper electrode 116, there is a second problem in that separation may take place between the electrode and the interlayer insulating film due to inferior bondability with the interlayer insulating film to thereby reduce the manufacturing yield of the DRAMs. On the other hand, mere provision of a bond layer between the lower capacitor electrode and the interlayer insulating film may result in deformation in shape of the lower capacitor electrode as a result of stress set-up occurring between the bond layer and the lower capacitor electrode, accompanied by reduction in capacitor characteristic.

In the manufacture of the DRAM, a heat treatment is carried out after formation of the lower capacitor electrode 130 for the purpose of improving the crystalline property of the capacitor dielectric film 115 and also to improve the contact between the metallic wiring and the connecting member 111. During such heat treatment, ruthenium or the like used for the lower capacitor electrode 130 tends to be oxidized resulting in not only surface irregularities, but also deformation in shape of the lower capacitor electrode 130, to such an extent as to increase the capacitor leak current.

SUMMARY OF THE INVENTION

Accordingly, the present invention is to provide an improved semiconductor device having an increased heat resistance and a method of making the same, wherein although ruthenium or iridium is employed as material for the lower capacitor electrode, the lower capacitor electrode will not deform during the heat treatment and, therefore, does not accompany deterioration of the capacitor characteristic.

The present invention is based on the finding that if the lower capacitor electrode is made of ruthenium or iridium containing a certain concentration of one or a mixture of impurity elements such as oxygen and titanium, reaction of the material for the lower capacitor electrode with Si contained in the connecting member during the heat treatment which would eventually result in deformation of the lower capacitor electrode and, hence, deterioration of the capacitor characteristic can be effectively avoided to provide a highly heat resistant capacitor cell.

Specifically, the present invention in one aspect provides a semiconductor device which comprises a semiconductor substrate having a major surface; a first interlayer insulating film formed on the semiconductor substrate and having an opening defined therein so as to open at the major surface of the semiconductor substrate; a connecting member made of Si as a principal component and embedded in the opening; a lower capacitor electrode connected electrically with the major surface of the semiconductor substrate through the connecting member; a capacitor dielectric film formed on the lower capacitor electrode; an upper capacitor electrode formed on the capacitor dielectric film; and a second interlayer insulating film formed on the capacitor upper electrode. The lower capacitor electrode referred to above is made of a principal component selected from the group consisting of ruthenium and iridium and contains oxygen in a quantity of 0.001 to 0.1% by atom and/or at least one impurity element in a quantity of 0.1 to 5% by atom. The impurity element is selected from the group consisting of titanium, chrome, tungsten, cobalt, palladium and molybdenum.

The use of a metallic element comprised of ruthenium or iridium as a principal component for the lower capacitor electrode is effective to improve the workability of the electrode and the presence of the oxygen in a quantity within the range of 0.001 to 0.1% by atom is effective to suppress a silicide forming reaction between Si, contained in the connecting member, and ruthenium or iridium while avoiding any possible increase of resistance which would result from oxidization of Si in the connecting member, so that any possible deformation in shape of the lower capacitor electrode which would otherwise result from the formation of the silicide can be effectively avoided to thereby suppress increase of the capacitor leak current.

Also, with this structure, no diffusion preventing film which has hitherto been necessitated to prevent Si in the connecting member from being diffused into the platinum electrode, thus making it possible to simplify the manufacturing step.

Preferably, a bond layer may be formed between the lower capacitor electrode and the first interlayer insulating film and/or between the upper capacitor electrode and the second interlayer insulating film. Though if the capacitor electrode is formed by the use of ruthenium or iridium a problem would arise in connection with the bondability with the interlayer insulating film. However, the use of the bond layer is effective to increase the bondability between the capacitor electrode and the interlayer insulating layer to thereby avoid any possible interlayer separation during the manufacture.

Where the bond layer is employed, it is preferred to be in the form of one of films of nitride titanium, non-crystalline silicon or a laminated structure of those films. In addition, in order to avoid any possible deformation of the capacitor electrode which would result from stress set-up occurring between the bond layer and the capacitor electrode, the bond layer should have a film thickness not greater than 50 nm.

The present invention in another aspect thereof also provides a method of manufacturing a semiconductor device comprising the steps of forming a first interlayer insulating film on a semiconductor substrate having a major surface, said first interlayer insulating film having an opening defined therein so as to open at the major surface of the semiconductor substrate; embedding a connecting member in said opening, said connecting member being made of Si as a principal component; forming a metallic thin-film on the connecting member and the first interlayer insulating film, said metallic thin-film being made of a principal component selected from the group consisting of ruthenium and iridium, said lower capacitor electrode containing oxygen in a quantity of 0.001 to 0.1% by atom and/or at least one impurity element in a quantity of 0.1 to 5% by atom, said impurity element being selected from the group consisting of titanium, chrome, tungsten, cobalt, palladium and molybdenum; processing the metallic thin-film to form a lower capacitor electrode electrically connected with the major surface of the semiconductor substrate through the connecting member; forming a capacitor dielectric film on the lower capacitor electrode; and sequentially forming an upper capacitor electrode, a second interlayer insulating film on the capacitor dielectric film.

Preferably, the metallic thin-film forming step may be carried out by the use of a sputtering technique under a condition in which a substrate temperature is within the range of 300 to 500° C. and an oxygen partial pressure within the range of $1\times10^{-6}$ to $1\times10^{-4}$ Torr are used. The use of the sputtering technique under the specific condition is effective to facilitate formation of the ruthenium or iridium thin-film containing a desired quantity of oxygen.

Alternatively, the metallic thin-film forming step may be carried out by annealing at a temperature within the range of 400 to 600° C. after the metallic thin-film has been formed on the connecting member and the first interlayer insulating film, to adjust the quantity of the oxygen contained in the metallic thin-film to a value within the range of 0.001 to 0.1% by atom. In such case, the annealing is effective to adjust the oxygen content in the ruthenium or iridium thin-film to a desired value after the formation of the thin-film.

Again preferably, the capacitor dielectric film forming step may be carried out by heat-treating the capacitor dielectric film under a condition in which a temperature of the semiconductor substrate within the range of 650 to 750° C. and an oxygen partial pressure within the range of 0.01 Torr or lower are employed, to thereby increase crystallizability of the capacitor dielectric film without allowing the lower capacitor electrode to be oxidized. This is particularly advantageous in that while any possible deformation of the capacitor electrode which would otherwise result from a surface oxidization of the lower capacitor electrode is prevented, the crystallizability of the capacitor dielectric film can be increased and the dielectric constant of the capacitor dielectric element can be improved without being accompanied by reduction in capacitor characteristic, making it possible to facilitate formation of a high capacity capacitor.

Again preferably, a step of giving a thermal history to the metallic thin-film which may be carried out subsequent to the metallic thin-film forming step so that any possible deformation of the metallic thin-film during the subsequent heat treatment can be avoided to avoid generation of a capacitor current leaking therefrom.

According to a preferred embodiment of the present invention, a step of giving a thermal history to the metallic thin-film, and a step of chemically and mechanically polishing a surface of the metallic thin-film to flatten said surface may be carried out subsequent to the metallic thin-film forming step so that any possible deformation of the metallic thin-film during avoided the subsequent heat treatment can be avoided to avoid generation of a capacitor current leaking therefrom.

According to another preferred embodiment of the present invention, a step of giving a thermal history to the metallic thin-film and, at the same time, heating the capacitor dielectric film to increase crystallizability of the capacitor dielectric film may be carried out subsequent to the capacitor dielectric film forming step to increase crystallizability of the capacitor dielectric film.

According to a further preferred embodiment of the present invention, the thermal history giving step may include a step of forming a cover layer on one of the metallic thin layer and the capacitor dielectric film for retaining a surface flatness of the metallic thin-film, a step of giving a thermal history by heating the metallic thin-film at a temperature higher than the highest possible temperature which would be employed during subsequent heat treatment, and a step of removing the cover layer. The use of the covering layer is effective to avoid any possible deformation of the lower capacitor electrode and also to give the thermal history to the metallic thin-film.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

Embodiment 1—FIGS. 1 to 6

Figure 1:
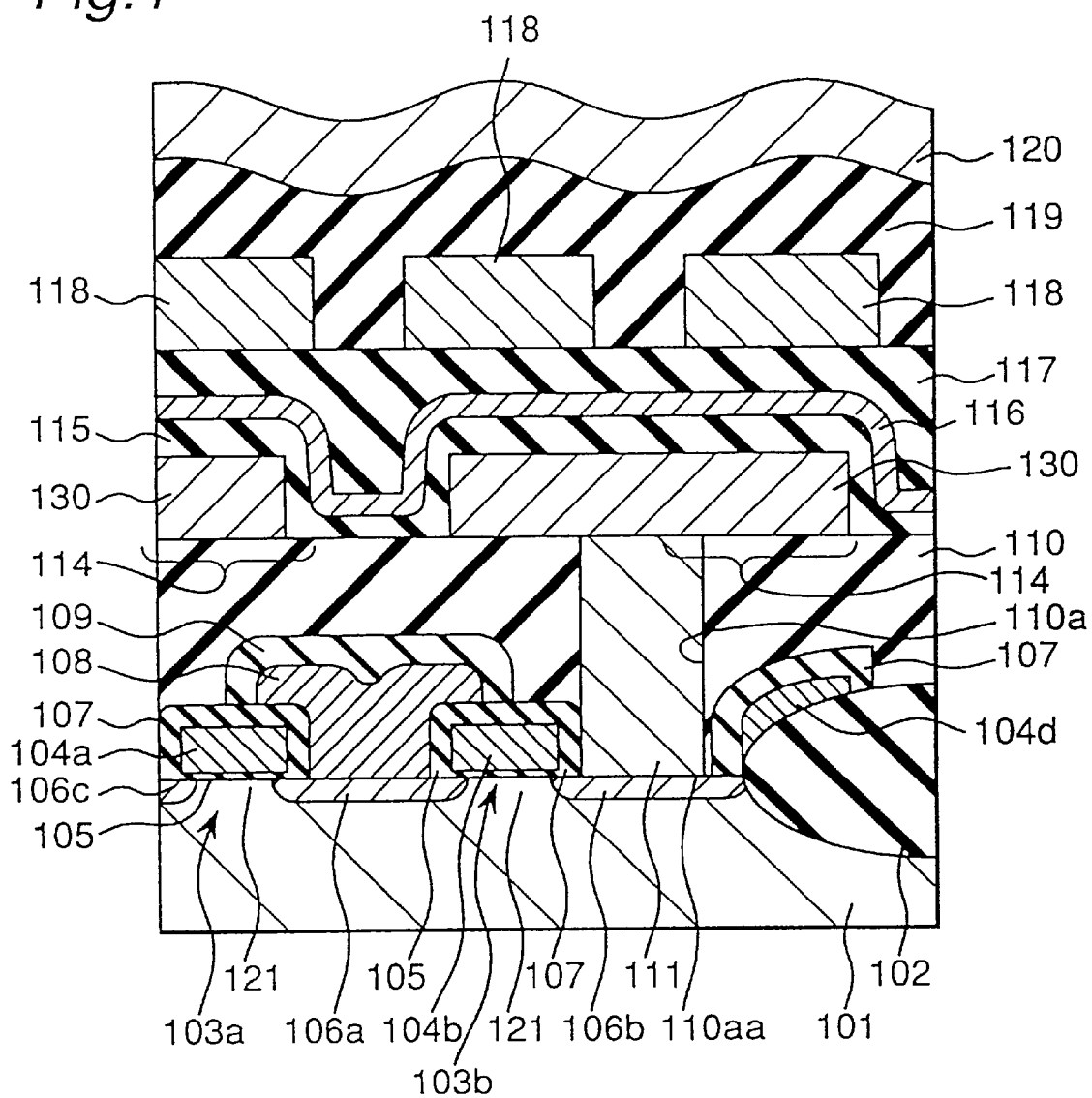
FIG. 1 is a partial sectional view of a DRAM according to a first embodiment of the present invention.

Referring to FIG. 1, there is shown the construction of the DRAM according to a first embodiment of the present invention. A lower structure of the capacitor shown in FIG. 1 and including a P-type semiconductor substrate 101, a field oxide film 102, transfer gate transistors 103a and 103b, N-type impurity regions 106a, 106b and 106c, a channel region 121, a gate insulating film 105, gate electrodes 104a and 104b,transfer gate transistors 103a and 103b, an oxide film 107, an embedded bit wire 108, an insulating layer 109, a first interlayer insulating film 110, a contact hole 110a, a plug 111 and so on, is substantially identical with that of the prior art DRAM. Also, an upper structure of the capacitor shown therein and including a second interlayer insulating film 117, a first aluminum wiring layer 118, a protective film 119, an aluminum wiring layer 120 and so on is substantially identical with that of the prior art DRAM. Accordingly, the details thereof will not be reiterated for the sake of brevity.

Furthermore, a capacitor 160 employed in the DRAM shown in FIG. 1 is, as is the case with that employed in the prior art DRAM, comprised of a lower capacitor electrode 130, a capacitor dielectric film 115 and a capacitor upper electrode 116, it being however to be noted that the lower capacitor electrode 130 employed in the practice of the present invention is in the form of a ruthenium thin-film containing oxygen.

As shown in FIG. 1, a ruthenium film including oxygen in 0.001 to 0.5% by atom is used as the lower capacitor electrode 130, with the film thickness being 100 to 300 nm. The capacitor dielectric film 115 and an upper capacitor electrode 116 are sequentially formed on an upper portion of the lower capacitor electrode 130 so as to cover the lower capacitor electrode 131. BaTiO$_3$ film of 30 to 120 nm in thickness formed by a CVD method is used for the capacitor dielectric 115. Ruthenium thin-film of 50 to 200 nm in thickness is used for the upper capacitor electrode 116. A second interlayer insulating film 117 or the like is formed on the upper capacitor electrode 116 so as to cover the upper capacitor electrode 116.

Figure 2:
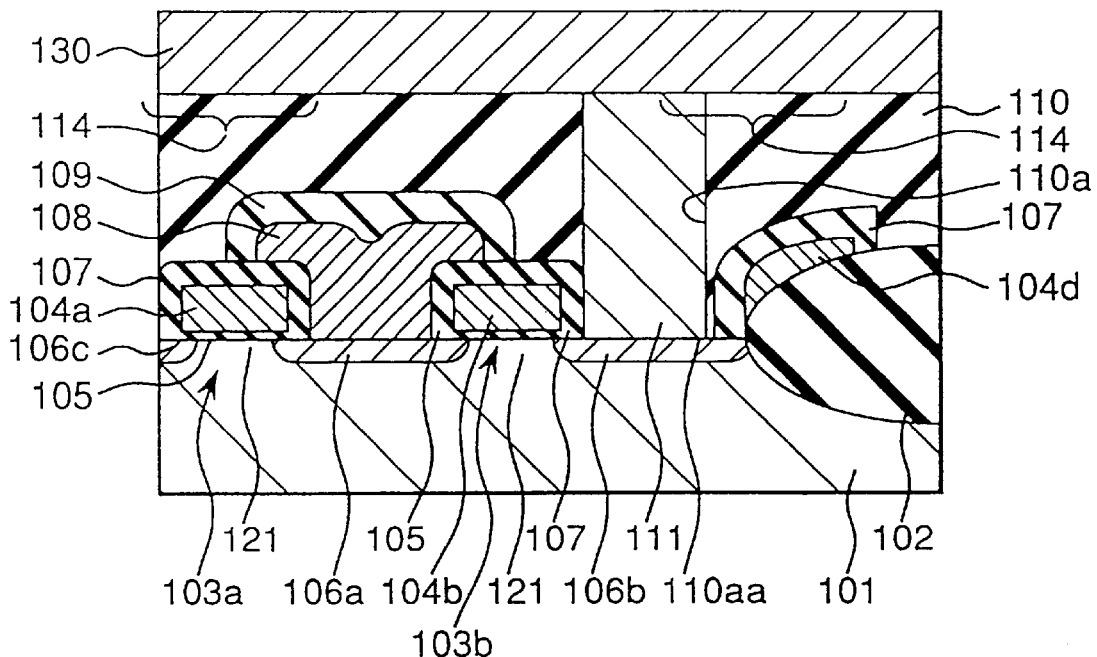
FIG. 2 is a partial sectional view of the DRAM, showing one of manufacturing steps in the first embodiment of the present invention.
Figure 3:
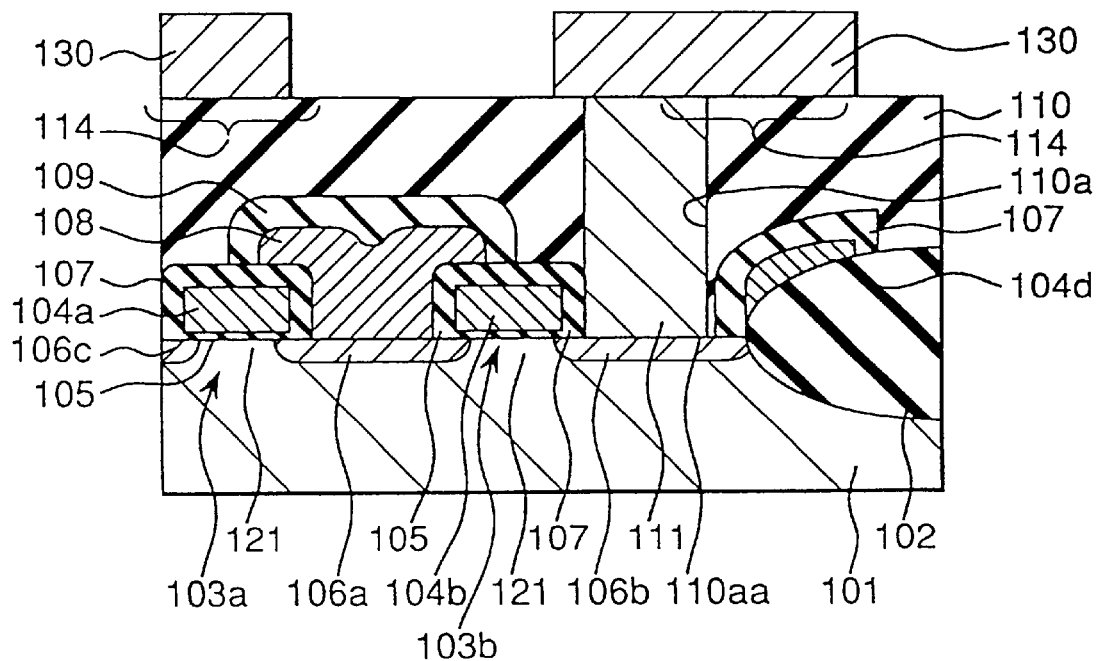
FIG. 3 is a partial sectional view of the DRAM, showing another one of the manufacturing steps in the first embodiment of the present invention.
Figure 4:
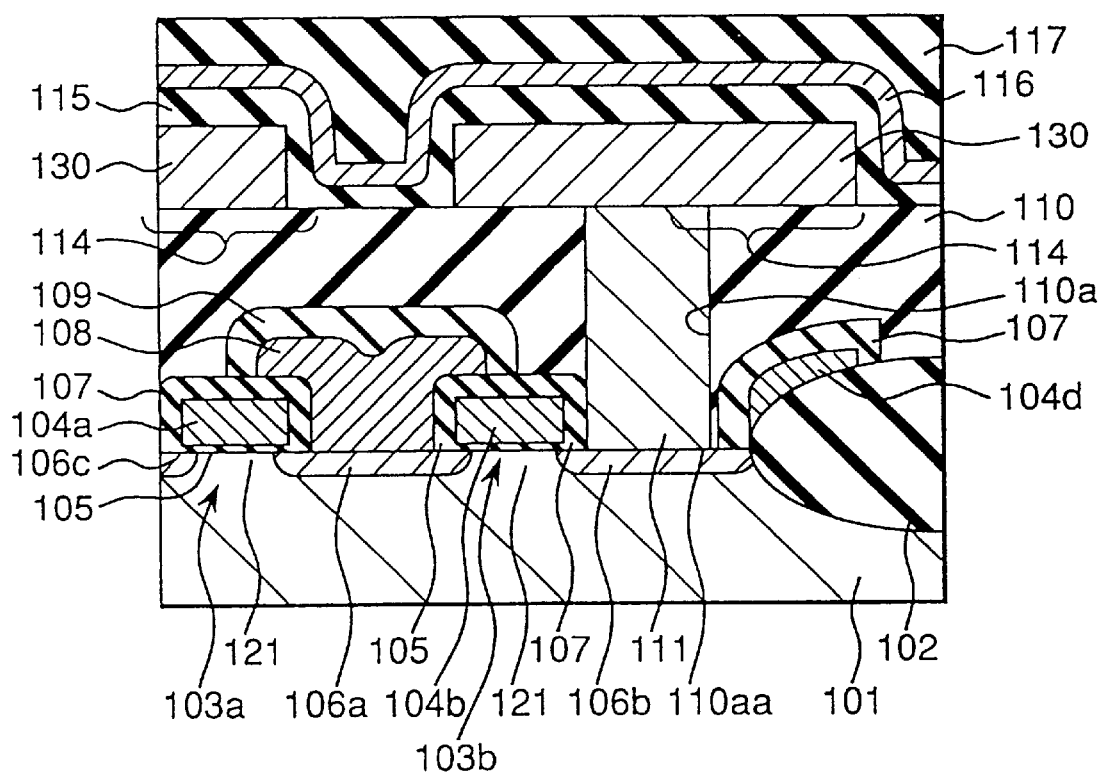
FIG. 4 is a partial sectional view of the DRAM, showing a further one of the manufacturing steps in the first embodiment of the present invention.

FIGS. 2 to 4 are partial sectional views showing sequential steps of manufacture of the DRAM according to the first embodiment of the present invention.

As shown in FIGS. 2, transfer gate transistors 103a and 103b are formed in a manner similar to those in the conventional one, and a first interlayer insulation film 110 having an opening 110a in which the connecting member 111 containing Si as a principal component is embedded is subsequently deposited on the transfer gate transistors 103a and 103b. Thereafter, by the use of any known sputtering technique a ruthenium film containing oxygen is formed over the connecting member 111 and the first interlayer insulation film 110.

Specifically, formation of the ruthenium film containing oxygen is preferably carried out by the sputtering technique in which argon gas and oxygen gas as are used as a sputter gas, and under such conditions employing 300 to 500° C. in substrate temperature, $5 \times 10^{-3}$ to $3 \times 10^{-2}$ Torr in argon partial gas pressure, $1 \times 10^{-6}$ to $1 \times 10^{-4}$ Torr in oxygen partial gas pressure.

Then, as shown in FIG. 3, a resist pattern is formed on the ruthenium film, and by the use of an RIE technique in which an etching gas containing oxygen as a principal component is employed and also using the resist pattern as a mask, the lower capacitor electrode 130 is formed for connection with the plug 111 for each memory cell. After the formation of the lower capacitor electrode 130, and as shown in FIG. 4, the capacitor dielectric film 115 and the upper capacitor electrode 116 are sequentially formed on the upper portion of the lower capacitor electrode 130 so as to cover the lower capacitor electrode 130. The capacitor dielectric film 115 in the form of a $BaTiO_3$ film of 30 to 100 nm in film thickness is formed by the use of the CVD method. Also, ruthenium thin-film of 50 to 150 nm in thickness is used for the upper capacitor electrode 116.

Then, a second interlayer insulating film 117 composed of $SiO_2$ is deposited so as to cover the upper capacitor electrode 116 by the use of the CVD method or the like and annealing of the second interlayer insulating film 117 to flatten the latter is subsequently effected at 650° C. or 700° C. Finally, in a manner similar to that used to fabricate the prior art DRAM, a first aluminum wiring layer 118, a protective film 119 composed of $SiO_2$ or the like and a second aluminum wiring layer 120 are successively formed to complete the DRAM shown in FIG. 1.

Figure 5:
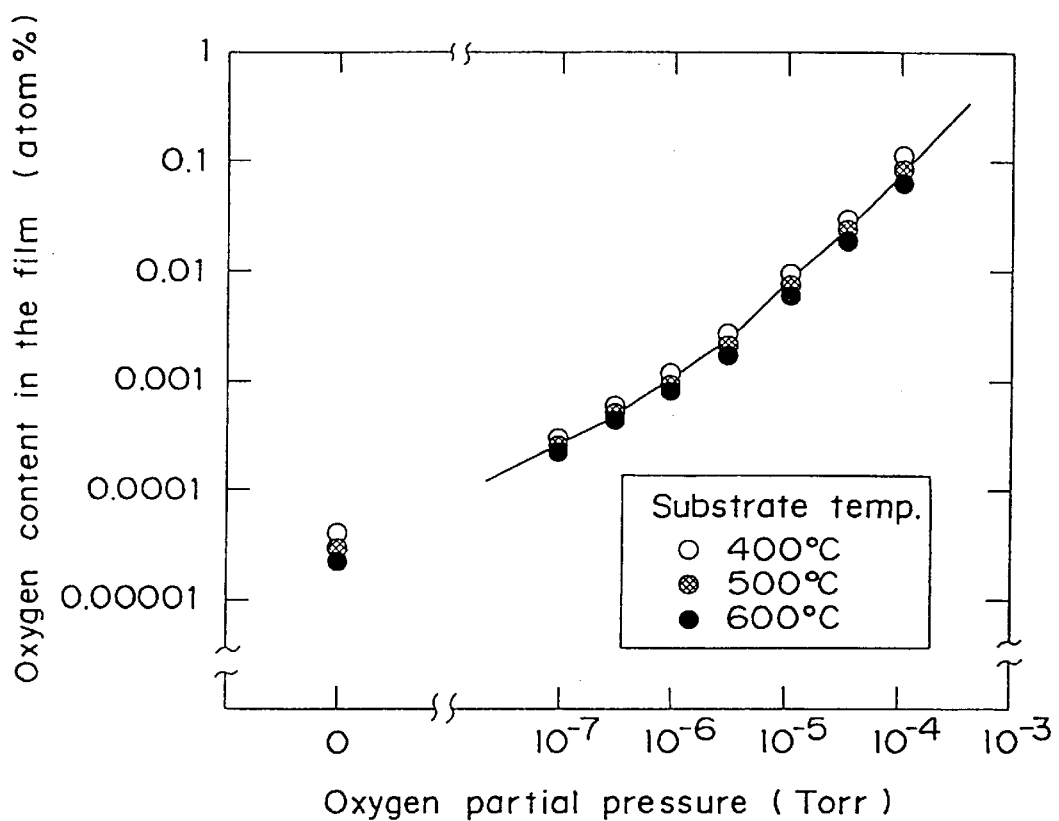
FIG. 5 is a graph showing the relationship between the oxygen partial pressure and the oxygen content in the film at the time of deposition of a ruthenium thin-film in the first embodiment of the present invention.

FIG. 5 shows the relationship between the oxygen partial pressure at each substrate temperature and the oxygen content in the ruthenium film when the ruthenium film as the lower capacitor electrode 130 is formed by a sputtering method. The oxygen content is expressed in terms of percent and is evaluated by a secondary ion mass analyzing method.

FIG. 5 makes it clear that the higher the oxygen partial pressure is during the sputtering, or the lower the substrate temperature is, the higher the oxygen content in the ruthenium film is. From the graph of FIG. 5, it will readily be understood that in order to render the oxygen content in the ruthenium film to be within the range of 0.001 to 0.1% where the substrate temperature during the formation of the ruthenium film is chosen to be within the range of 300 to 500° C., the oxygen partial pressure has only to be within the range of approximately $1 \times 10^{-6}$ to $1 \times 10^{-4}$ Torr. It is also readily be understood that the oxygen partial pressure has only to be within the range of approximately $3 \times 10^{-6}$ to $3 \times 10^{-5}$ Torr where the oxygen content in the ruthenium film is desired to be within the range of 0.003 to 0.03% in range.

Figure 6:
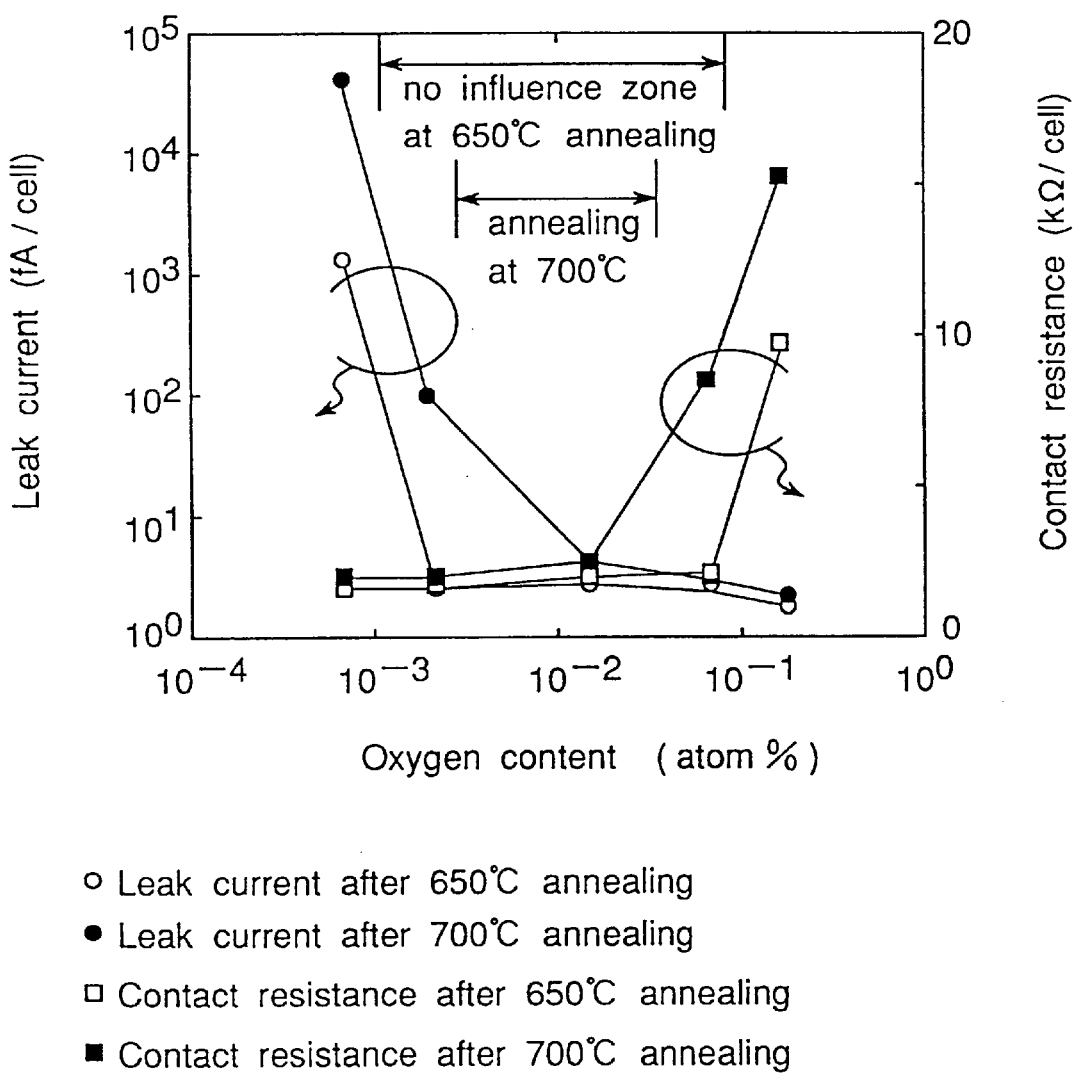
FIG. 6 is a graph showing the relationship among the oxygen content in the ruthenium thin film, the leak current after the heat treatment and the contact resistance in the first embodiment of the present invention.
Figure 7:
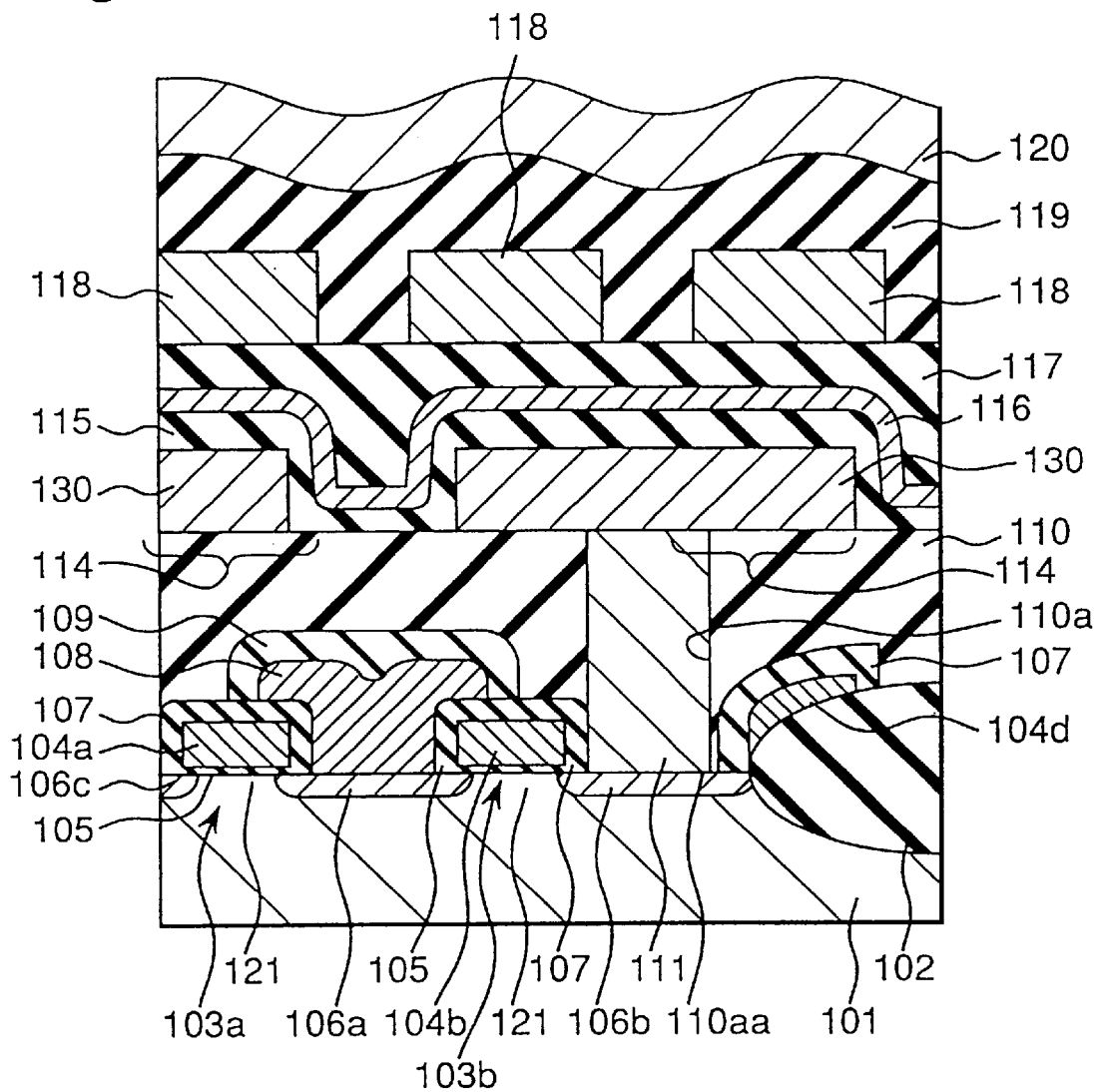
FIG. 7 is a partial sectional view of the DRAM according to a second embodiment of the present invention.

FIG. 6 shows the relationship, together with the annealing temperatures (650° C., 700° C.) used to flatten the second interlayer insulating film 117, among the oxygen content in the lower capacitor electrode, the capacitor leak current (current flowing between the lower and upper electrodes through the dielectric film), and the contact resistance (electric resistance between the lower capacitor electrode and the semiconductor substrate through the connecting member), obtained on each of samples in which the ruthenium films of different oxygen contents are employed as a lower capacitor electrode.

FIG. 6 makes it clear that where the oxygen content in the ruthenium thin-film is lower than 0.001%, the annealing at 650° C. results in increase of the capacitor leak current, but if the oxygen content in such ruthenium thin-film is chosen to be not lower than 0.001%, increase of such capacitor leak current can be suppressed. The reason therefor appears to be because, if the oxygen content in the ruthenium thin-film is lower than 0.001%, Si contained in the connecting member 111 diffuse into and hence reacts with the ruthenium thin-film forming the lower capacitor electrode to form ruthenium silicide which brings about deformation of the lower capacitor electrode. On the other hand, if the oxygen content in the ruthenium thin-film is chosen to be not lower than 0.001%, it appears that precipitation of oxygen compound in ruthenium crystals suppresses diffusion of Si into the ruthenium thin-film to thereby suppress formation of the suicide with no deformation of the lower capacitor electrode occurring consequently.

On the other hand, if the oxygen content in the ruthenium thin-film is increased to a value not lower than 0.05%, it appears that the use of the annealing temperature of 650° C. may result in increase of the contact resistance by 2 to 3 units. This appears because the oxygen added to the ruthenium thin-film becomes excessive and Si in the connecting member 111 is consequently oxidized during the annealing to form an insulating layer with $SiO_2$ as principal component.

From the foregoing, it has now become clear that, provided that the oxygen content in the ruthenium film is controlled to 0.001 to 0.05%, increase of the contact resistance and increase of the leak current resulting from deformation of the lower capacitor electrode can be suppressed even though the annealing is carried out at 650° C. to thereby provide a highly heat resistant capacitor cell. It has also become clear that where the oxygen content in the ruthenium film is controlled to 0.003 to 0.03%, increase of the contact resistance and increase of the leak current resulting from deformation of the lower capacitor electrode can be suppressed even if the annealing is carried out at 700° C.

It is to be noted that although reference has been made to the DRAM, the foregoing embodiment of the present invention and the embodiments of the present invention which follow can be equally applied to any other semiconductor device utilizing a thin-film capacitor in which a high dielectric film is employed.

Embodiment 2—FIGS. 7 to 11

A second embodiment of the present invention will be described in accordance with FIGS. 7 to 11.

In the embodiment shown in FIGS. 7 to 11, the lower capacitor electrode 130 is in the form of an iridium electrode containing 0.001 to 0.1% of oxygen and having a film thickness of 100 to 300 nm. The capacitor dielectric film 115 and the upper capacitor electrode 116 are sequentially formed on the upper portion of the lower capacitor electrode 130 to cover the lower capacitor electrode 130 as is the case with the foregoing embodiment. In this embodiment, $BaTiO_3$ film of 30 to 120 nm in thickness formed by a CVD method is used as the capacitor dielectric film 115 and, also, the iridium thin-film of 50 to 2000 nm in thickness is used as the upper capacitor electrode 116. The second interlayer insulating film 117 or the like is formed on the upper capacitor electrode 116 to cover the upper capacitor electrode 116.

Figure 8:
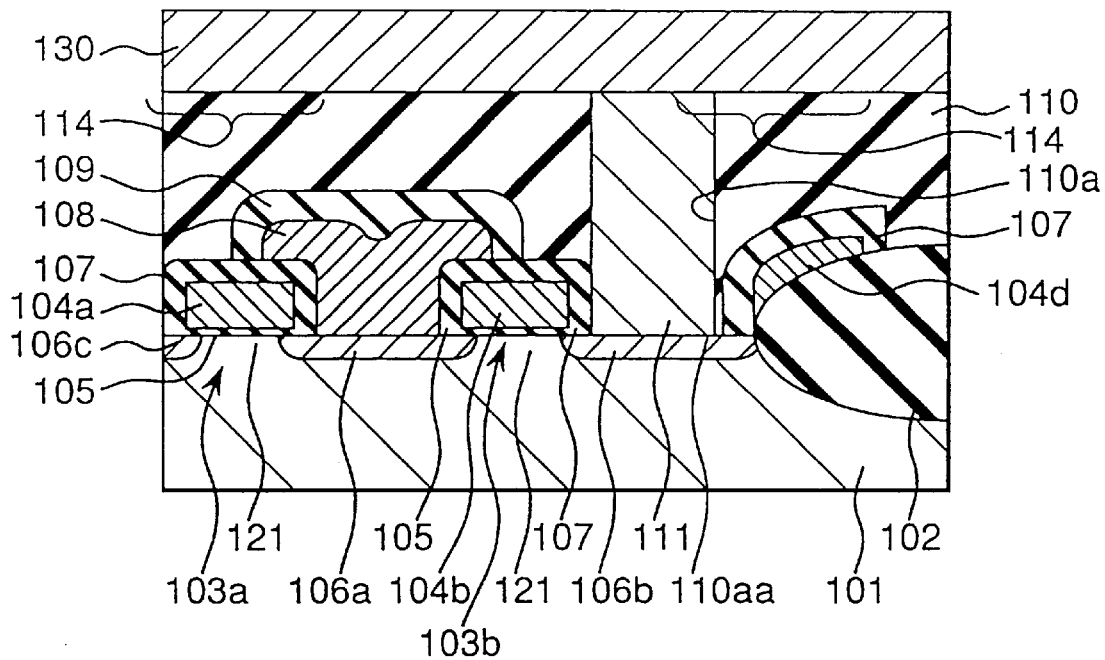
FIG. 8 is a partial sectional view of the DRAM, showing one of the manufacturing steps in the second embodiment of the present invention.

In FIG. 8, the iridium film of 100 to 300 nm in film thickness containing oxygen in a quantity not higher than 0.0005% is formed as the lower capacitor electrode on the first interlayer insulating film 110 and the connecting member 111 by the use of the known sputtering method in which an argon gas is employed as a sputtering gas. The iridium thin-film so formed is subsequently annealed for 120 minutes at 400 to 600° C., preferably 500 to 600° C., under an oxygen atmosphere, followed by annealing for 60 minutes at the same temperature under a hydrogen atmosphere.

Figure 11:
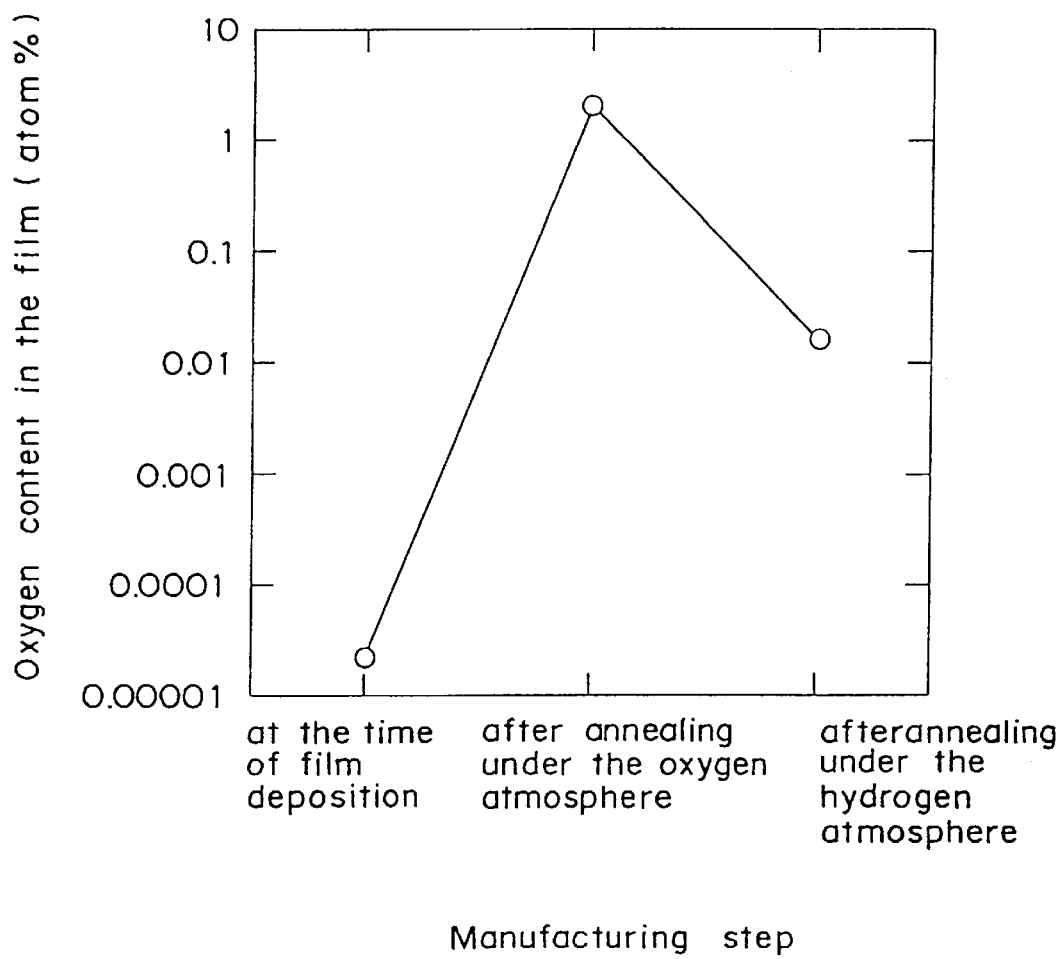
FIG. 11 is a graph showing change in oxygen content in the film with change in manufacturing step in the second embodiment of the present invention.

FIG. 11 shows the respective oxygen content in the iridium thin-film forming the lower capacitor electrode at the time of film deposition, after the annealing under the oxygen atmosphere and after the annealing under the hydrogen atmosphere, respectively. The oxygen contents shown in FIG. 11 are a value evaluated by a secondary ion mass analyzing method.

Although the oxygen content in the film after the deposition thereof is not higher than 0.0005%, the annealing under the oxygen atmosphere for 120 minutes at 400 to 600° C. has resulted in diffusion of oxygen into the iridium thin-film to allow the latter to contain oxygen in a quantity of about 2%. When the subsequent annealing at 400 to 600° C. for 60 minutes under the oxygen atmosphere results in release of oxygen from the iridium thin-film to reduce the oxygen content in the iridium thin-film to thereby control the oxygen content to a desired value, that is, within the range of 0.001 to 0.1%. In this way, the oxygen content in the iridium film can be controlled to the desired value by effecting the annealing after formation of the iridium film forming the lower capacitor electrode.

Figure 9:
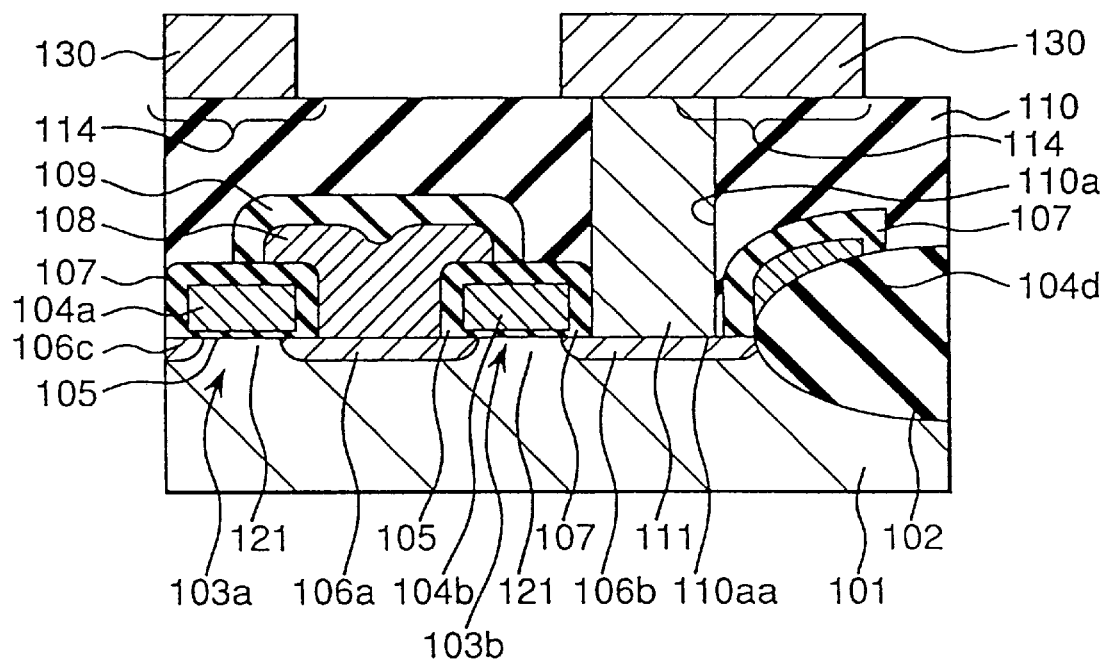
FIG. 9 is a partial sectional view of the DRAM, showing another one of the manufacturing steps in the second embodiment of the present invention.

Thereafter, as is the case with that carried out in the practice of the first embodiment, and as shown n FIG. 9, the resist pattern is formed on the iridium film, and the lower capacitor electrode 130 is then formed so as to connect with the connecting member 111 for each memory cell by the RIE method utilizing the oxygen gas as a principal component.

Figure 10:
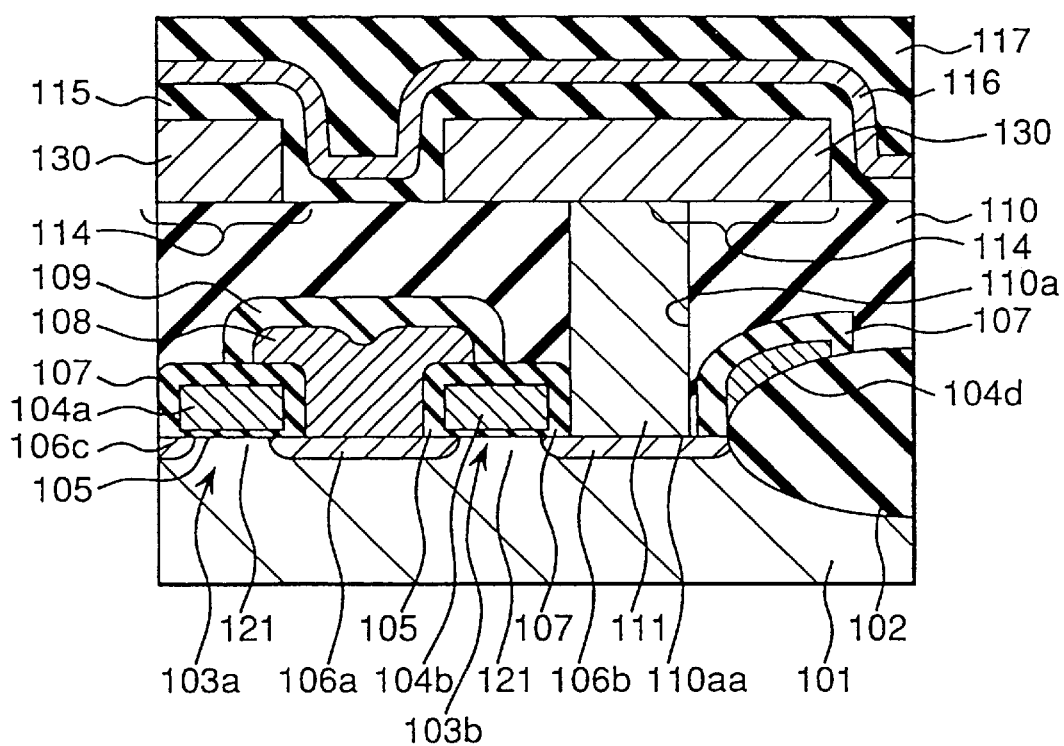
FIG. 10 is s a partial sectional view of the DRAM, showing a further one of the manufacturing steps in the second embodiment of the present invention.

As shown in FIG. 10, the capacitor dielectric film 115 and the upper capacitor electrode 116 are subsequently formed successively on the upper portion of the lower capacitor electrode 130 so as to cover the lower capacitor electrode 130 as is the case with the first embodiment. The $BaTiO_3$ film of 30 to 100 nm in thickness formed by a CVD method is used for the capacitor dielectric film 115 and, also, the iridium thin-film of 50 to 150 nm in thickness is used for the capacitor upper electrode 116.

Finally, a second interlayer insulating film 117 composed of $SiO_2$ is deposited to cover the upper capacitor electrode 116 by the use of the CVD method or the like, and an flattening annealing to flatten the dielectric film 117 is effected at 650° C. or 700° C. Thereafter, as is the case with the prior art, a first aluminum wiring layer 118, a protective film 119 composed of $SiO_2$ or the like and a second aluminum wiring layer 120 are successively formed to complete such a DRAM shown in FIG. 7.

Thus, in the practice of the second embodiment, the oxygen content in the iridium film can be controlled to the desired value, that is, within the range of 0.001 to 0.1% by atom by effecting the annealing under the oxygen atmosphere and subsequently under the hydrogen atmosphere after formation of the iridium film which eventually form the lower capacitor electrode. As in the first embodiment, it is possible to form a capacitor which is superior in heat resistance, free from increase of both of the leak current and the contact resistance which would otherwise result from deformation in shape of the lower capacitor electrode, by effecting the flattening annealing after the second interlayer film has been formed.

It is to be noted even if ruthenium thin-film is used for the lower capacitor electrode 130 in the practice of the second embodiment, the same effects as described above can be obtained.

Figure 12:
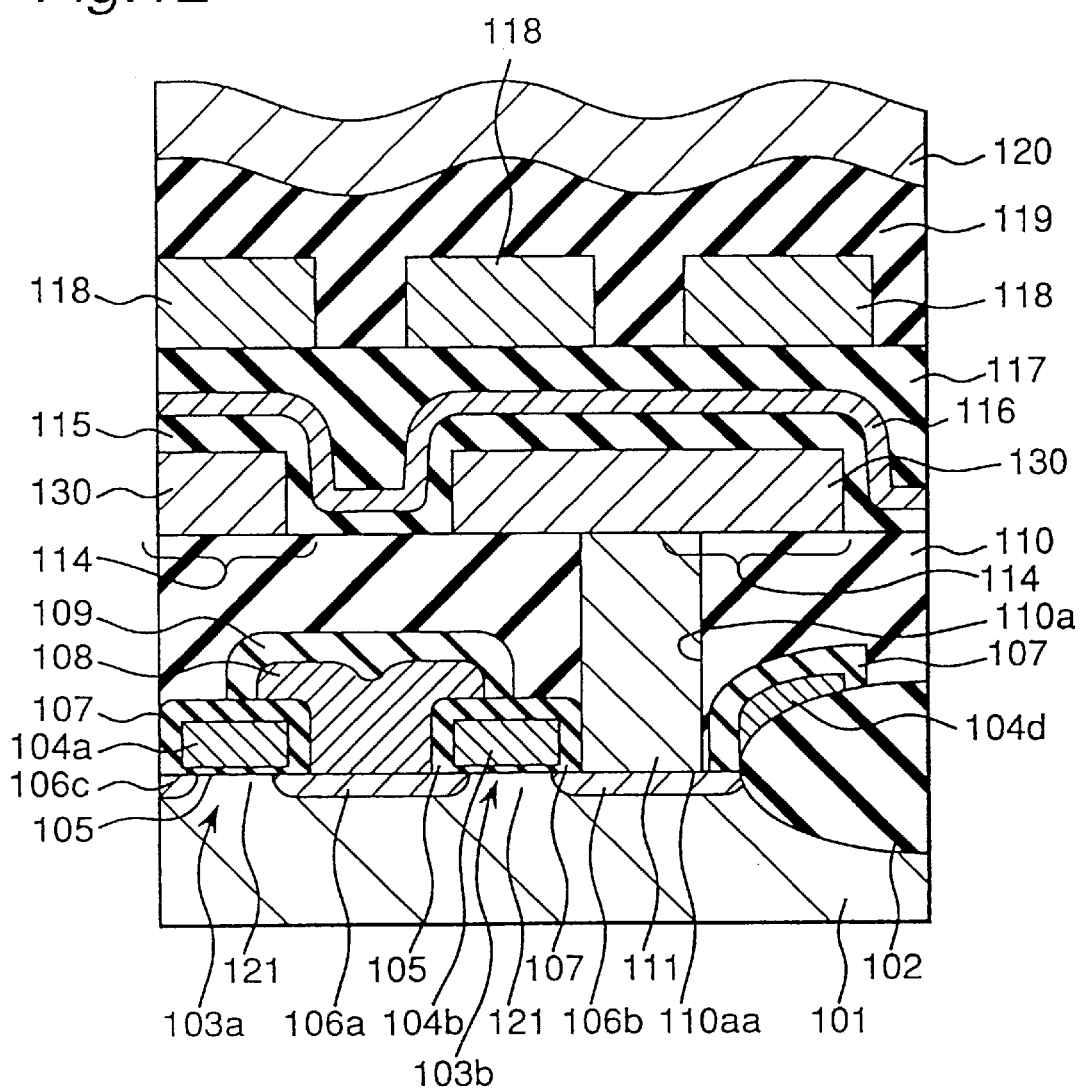
FIG. 12 is a partial sectional view of the DRAM according to a third embodiment of the present invention.
Figure 13:
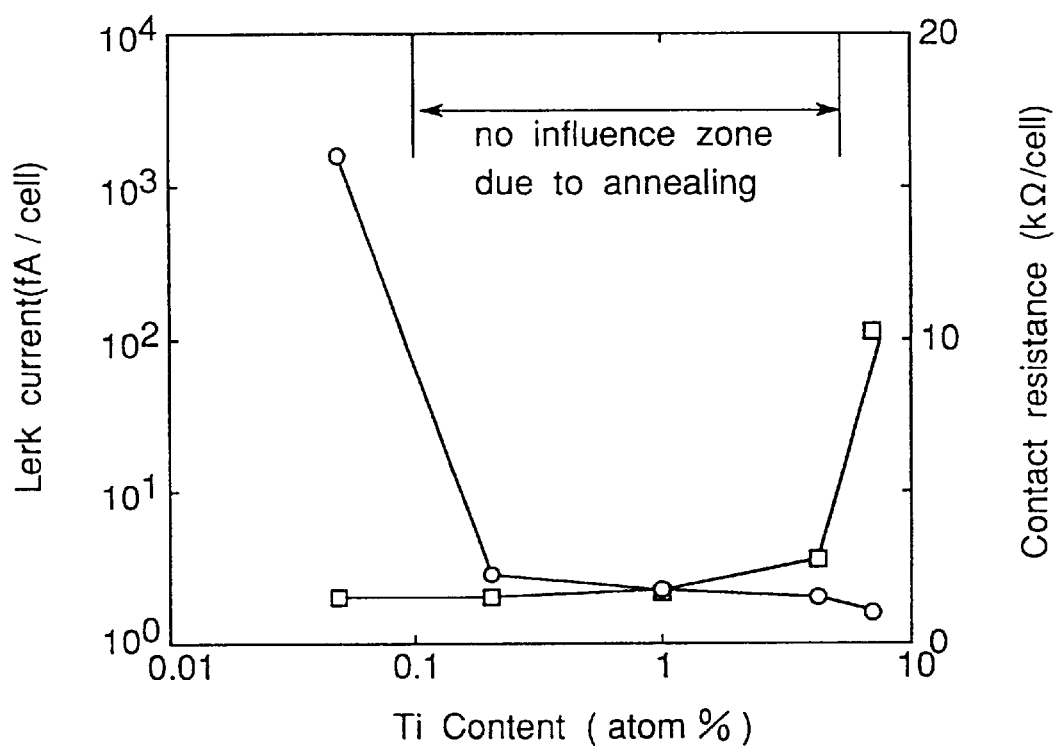
FIG. 13 shows relationship among the Ti content in the ruthenium thin-film, the leak current and the contact resistance in the third embodiment of the present invention.

Embodiment 3—FIGS. 12 and 13

In the present embodiment, a ruthenium film of 100 to 300 nm in thickness including 0.1 to 5% by atom of titanium is used for the lower capacitor electrode 130.

FIG. 13 shows the relationship between the titanium content in the ruthenium film forming the lower capacitor electrode, the capacitor leak current, and the contact resistance after the flattening annealing has been effected to the second interlayer insulating film 117 at 650° C.

The graph of FIG. 13 makes it clear that the capacitor leak current is low when the titanium content in the ruthenium thin-film is not lower than 0.1%, while the leak current rapidly increases when the titanium content is 0.1% or lower. The formation of the silicide of the ruthenium is confirmed by X ray diffraction in the ruthenium thin-film after the annealing operation and having the titanium content of 0.1%. Even in this case, as in the first embodiment, the capacitor leak current increases because of the deformation of the lower capacitor electrode by the formation of the silicide in the ruthenium thin-film.

The increase in the capacitor leak current can be suppressed if the titanium content in the ruthenium thin-film is controlled to a value not lower than 0.1%. This is because titanium added into the ruthenium thin-film is separated into the grain field of ruthenium to thereby suppress diffusion of Si into the ruthenium thin-film through such grain field to thereby suppress formation of the silicide in the ruthenium thin-film which would otherwise result in deformation of the lower capacitor electrode.

When the titanium content further increases to a value higher than 5% or more, the contact resistance increases. This appears to have resulted from the fact that titanium added excessively precipitates to form an oxide at a junction between an upper end of the connecting member 111 and the lower capacitor electrode 130 to thereby reduce the conductivity between the lower capacitor electrode 130 and the connecting member 111. The formation of the silicide by the reaction between the ruthenium and the Si in the connecting member (plug) 111 can be controlled, without the oxide of titanium being precipitated, by allowing the ruthenium thin-film, which eventually form the lower capacitor electrode 130, to contain titanium in a quantity of 0.1 to 5% by atom to thereby prevent deformation of the lower capacitor electrode. A capacitor cell can be formed which is not accompanied by increase in capacitor leak current and which has a high heat resistance even if the flattering annealing of the interlayer insulating film has been effected.

The effects brought about by the use of the titanium is recognized similarly even when the iridium thin-film is used for the lower capacitor electrode 130.

Also, similar effects are obtained even if one or a mixture of chromium, tungsten, cobalt, palladium and molybdenum is employed in place of titanium.

The present embodiment is effective to control the reaction between the silicide in the connecting member 111 or in the bond layer 136 and the ruthenium thin-film even if silicide material such as ruthenium silicide, iridium silicide, titanium silicide or the like is used for the connecting member (plug) 111 or the bond layer 136 to be described later in connection with a fourth preferred of the embodiment of the present invention.

Figure 14:
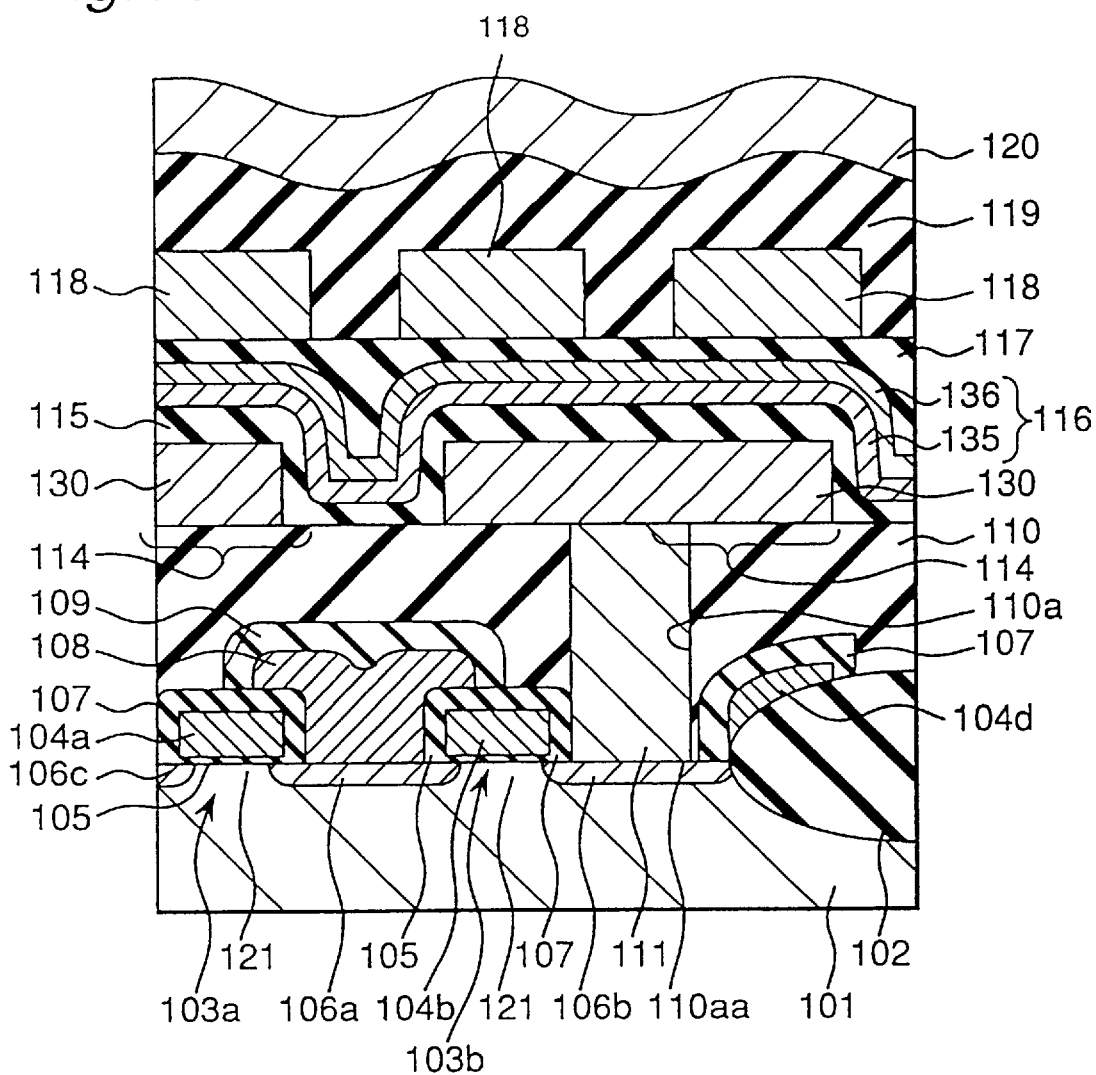
FIG. 14 is a partial sectional view of the DRAM according to a fourth embodiment of the present invention.
Figure 15:
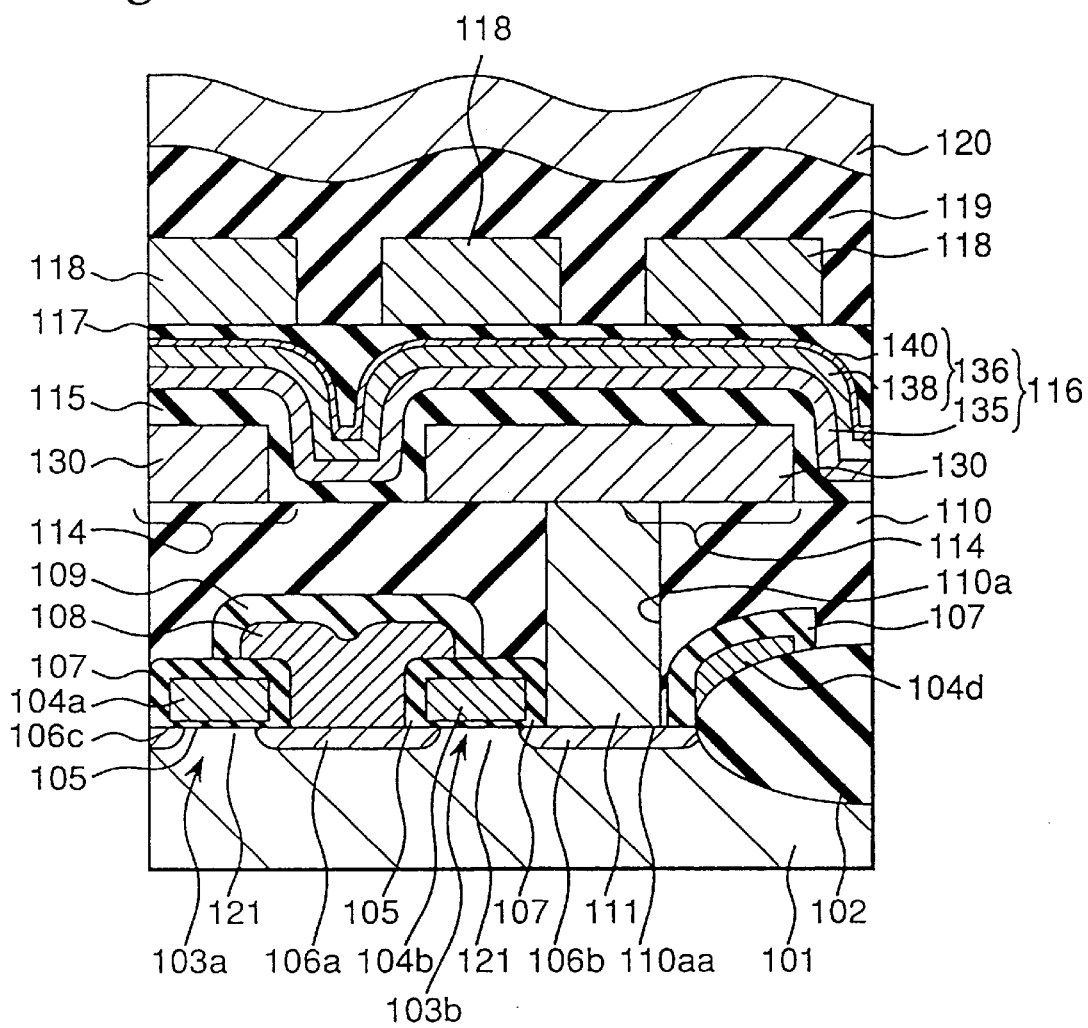
FIG. 15 is a partial sectional view of the DRAM according to the fourth embodiment of the present invention.

Embodiment 4—FIGS. 14 and 15

FIGS. 14 and 15 respectively show a partial sectional view of the DRAM in a fourth embodiment of the present invention. In the present embodiment, the ruthenium thin-film of 100 to 300 nm in thickness is used as the material for the lower capacitor electrode 130. The $BaTiO_3$ film of 30 to 120 nm in film thickness is formed by a CVD method as the capacitor dielectric 115.

Referring to FIG. 14, the upper capacitor electrode 116 is formed of the ruthenium thin-film of 50 to 200 nm in thickness. A bond layer 136 composed of titanium nitride thin-film is formed on it by a sputtering method. The film thickness of the bond layer 136 is preferably not greater than 50 nm so that the stress of the film may not affect the capacitor characteristics. In this embodiment, the film thickness is chosen to be within the range of 10 to 50 nm. The second interlayer insulating film 117 or the like is formed on the bond layer 136 as in the conventional construction.

Also, referring to FIG. 15, the ruthenium thin-film of 100 to 300 nm in thickness is used as the material for the lower capacitor electrode 130. $BaTiO_3$ film is used of 30 to 120 nm in film thickness formed by a CVD method as the capacitor dielectric 115.

Further, the upper capacitor electrode 116 is formed of ruthenium oxide thin-film of 50 to 200 nm in thickness. The bond layer 136 composed of a laminated structure including a titanium nitride thin-film 138 of 10 to 20 nm in thickness and a non-crystalline silicon thin-film 140 of 10 to 30 nm in thickness is formed thereon by a sputtering method. On the bond layer 136, the second interlayer insulating film 117 or the like is formed as in the conventional construction.

Table 1 shows the presence or absence of an interlayer separation and the capacitor leak current both exhibited when nitride titanium or nitride titanium and non-crystalline silicon are used for the bond layer 136.

TABLE 1

| Sample No. | TiN Film Thickness | a-Si Film Thickness (A) | Interlayer Separation at Manufacturing Step | Capacitor Leak Current (fA/cell) |
|---|---|---|---|---|
| 1 | 70 | 0 | Not Occurred | 100 |
| 2 | 50 | 0 | Not Occurred | 10 |
| 3 | 30 | 0 | Not Occurred | 7.3 |
| 4 | 40 | 20 | Not Occurred | 35 |
| 5 | 30 | 20 | Not Occurred | 10 |
| 6 | 10 | 10 | Not Occurred | 6 |
| 7 | 0 | 0 | Occurred | Unable to measure |

Table 1 shows that the use of the bond layer 136 composed of nitride titanium or nitride titanium and non-crystalline silicon is effective prevent the interlayer separation in the manufacturing step.

Also, the greater the film thickness of the bond layer 136, the more considerable the tendency of the capacitor leak current to increase. This is because the capacitor electrode is deformed due to the stress between the bond layer and the capacitor electrode. Table 1 above shows that the bond layer 136 preferably has a film thickness as small as 60 nm (e.g., Sample No. 4) or smaller to minimize the stress build-up.

From the foregoing, it has now become clear that the formation of the bond layer 136 on the upper capacitor electrode 116 is effective to avoid any possible interlayer separation between the upper capacitor electrode 116 and the second interlayer insulating film 117, which has hitherto been a problem when ruthenium was used for the upper capacitor electrode 116, and is also effective to improve the yield of manufacture of the DRAMs by the prevention of the interlayer separation of the interlayer insulating film 117 during the manufacture thereof. In particular, although in the bond layer 136, nitride titanium or non-crystalline silicon thin-film, or a laminated structure thereof can be used for the bond layer 136, the film thickness of the bond layer 136 should be 60 nm or smaller to prevent the reduction in the capacitor characteristics which would result from deformation of the capacitor electrode due to the influences of the film stress of the bond layer 136.

Although in the present embodiment ruthenium or ruthenium oxide is used as upper capacitor electrode 116, similar effects can be expected by the formation of the bond layer 136 even when iridium, iridium oxide or platinum is used. Also, in the present embodiment, other electrode materials such as platinum, iridium or the like can be used although the ruthenium film is used as the lower capacitor electrode 130. To increase the bondability between the first interlayer insulating film 110 and the lower capacitor electrode 130, the bond layer 136 may be formed between the lower capacitor electrode 130 and the first interlayer insulating film 110.

Figure 17A:
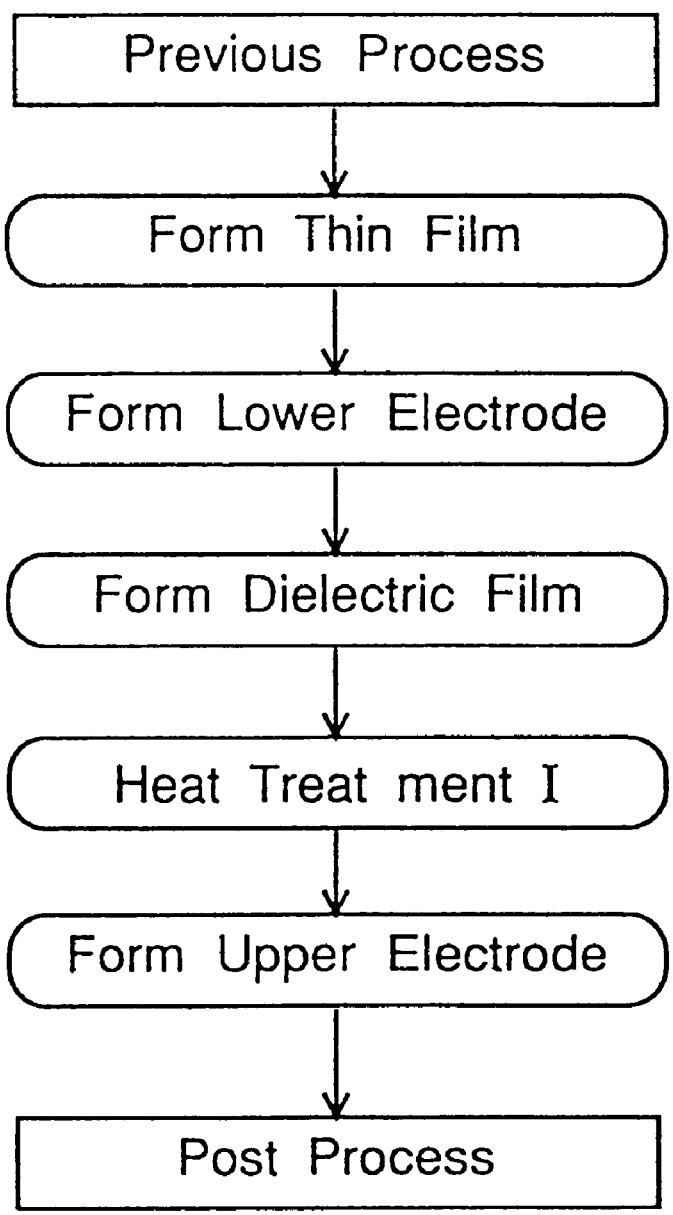
FIG. 17A is a process flow chart in the fifth embodiment of the present invention.

Embodiment 5—FIG. 17A

Figure 16:
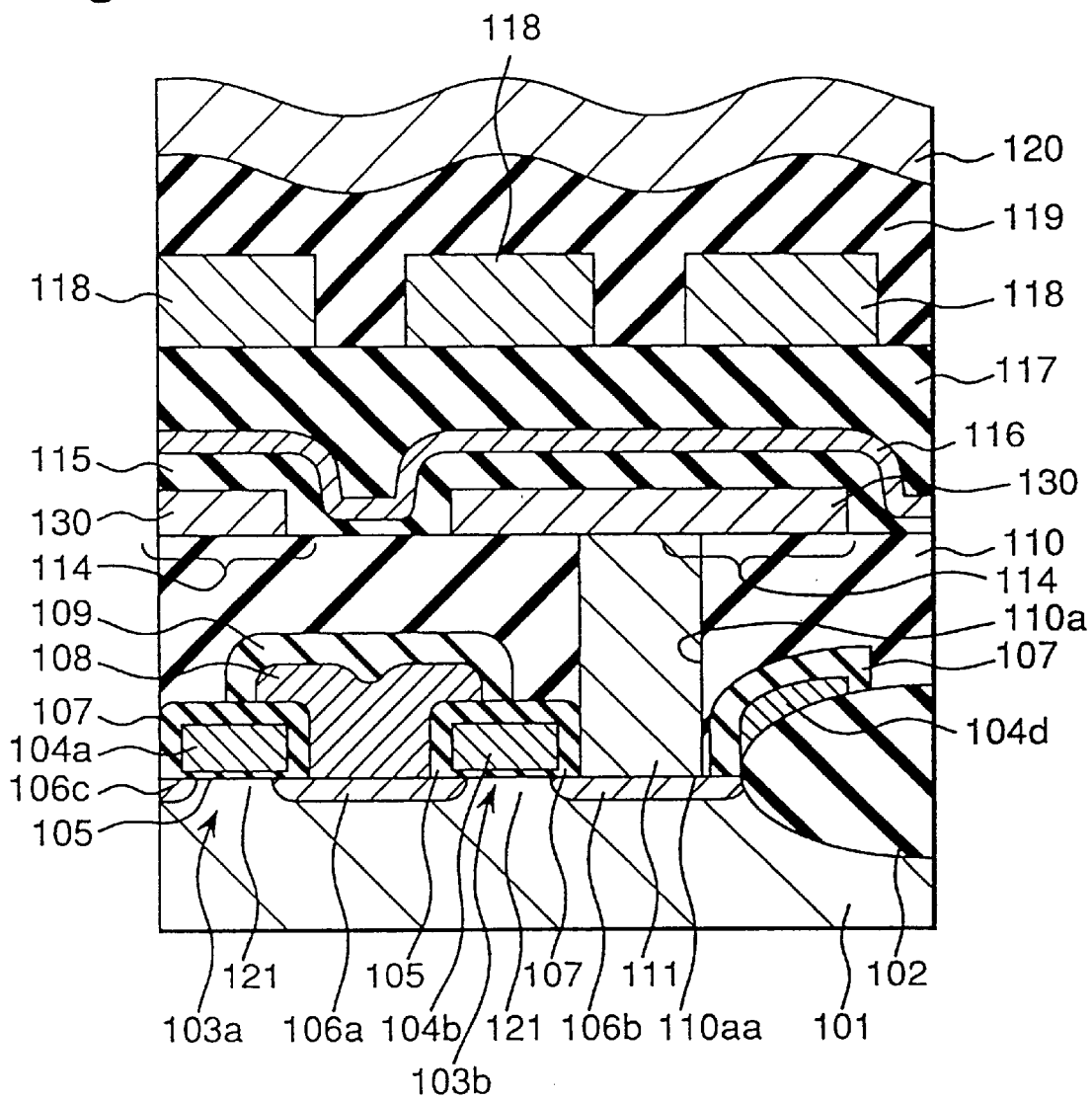
FIG. 16 is a partial sectional view of the DRAM showing fifth to eighth embodiments of the present invention.

FIG. 17A illustrates the sequence of manufacturing steps practiced to make the DRAM according to a fifth embodiment of the present invention, which DRAM is shown in FIG. 16 in a partial sectional view.

In this fifth embodiment, at first, the ruthenium film of 300 nm in thickness is formed on the upper portion of the first insulating film 110 and the connecting member 111 and is subsequently processed so as to form the lower capacitor electrode 130 and, thereafter, the capacitor dielectric film 115 is formed with the use of the $BaTiO_3$ film which is one of the dielectric materials having the perovskite construction. To form the capacitor dielectric film 115, a CVD method is selected from a view point of covering onto the side face of the lower capacitor electrode 130 to use the formation of the capacitor dielectric film 115 under the conditions of 500° C. at substrate temperature, 1 Torr in oxygen partial pressure so that ruthenium surface may not be oxidized during the CVD film formation.

Figure 18:
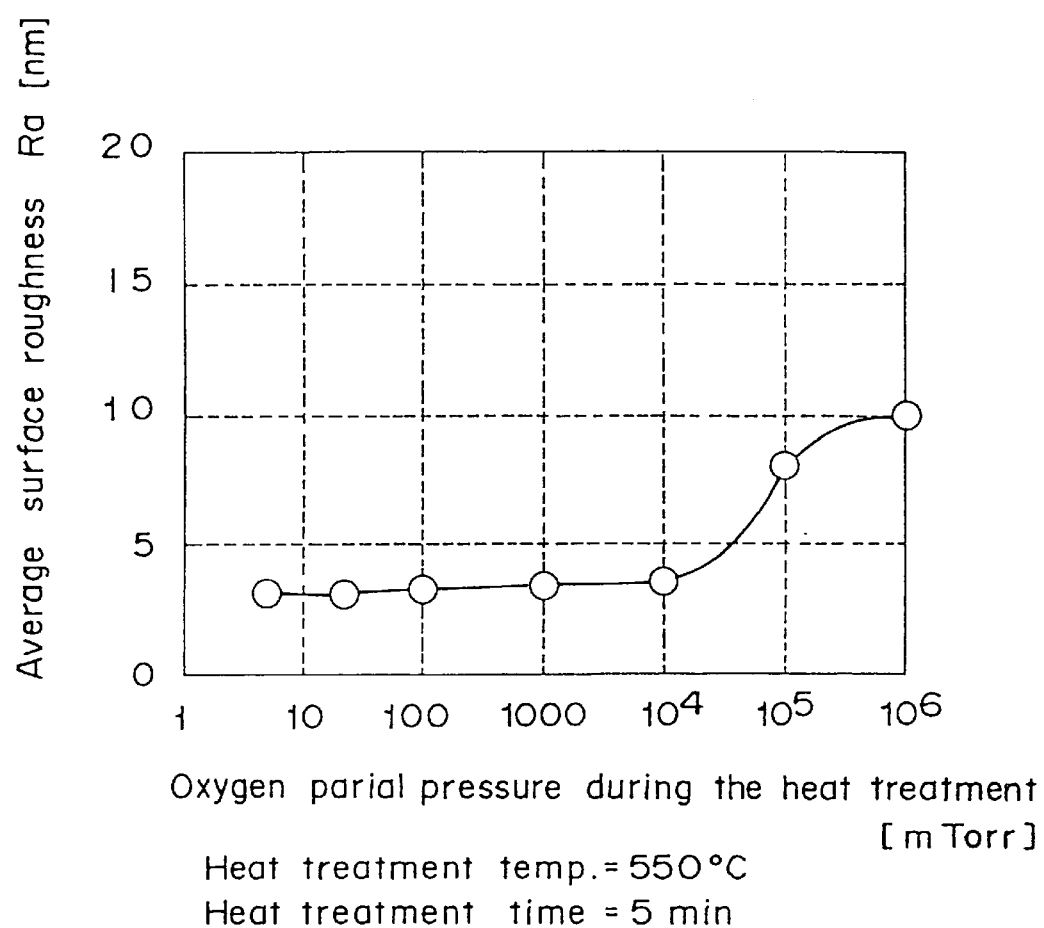
FIG. 18 is a graph showing the relationship between the oxygen partial pressure during the heat treatment and the average surface roughness of the ruthenium thin-film electrode in the fifth embodiment of the present invention.

FIG. 18 shows the relationship between the oxygen partial pressure and the average surface roughness of the ruthenium electrode measured by the use of an atomic force microscope during the heat treatment of ruthenium at 550° C. in substrate temperature. FIG. 18 shows that the surface of the ruthenium metallic electrode 130 does not become rough due to oxidization if the substrate temperature is not higher than 550° C. and the oxygen partial pressure is not higher than 15 Torr. Accordingly, if the CVD to form the capacitor dielectric film 115 is carried out under such conditions, the capacitor dielectric film 115 can be formed without being accompanied by oxidation of the surface of the lower capacitor electrode 130.

Then, when the capacitor dielectric film 115 so formed is heat-treated, the crystalline property of $BaTiO_3$ can be improved and the dielectric constant of the capacitor film 115 is increased. Such a heat treatment is effected for 30 seconds if the substrate temperature is, for example, 700° C. and the oxygen partial pressure is 3 m Torr in oxygen partial pressure. By this heat treatment effected in the low oxygen atmosphere, the crystalline property of the $BaTiO_3$ can be improved while preventing the surface oxidation of the lower capacitor electrode 130 during the heat treatment.

Figure 19:
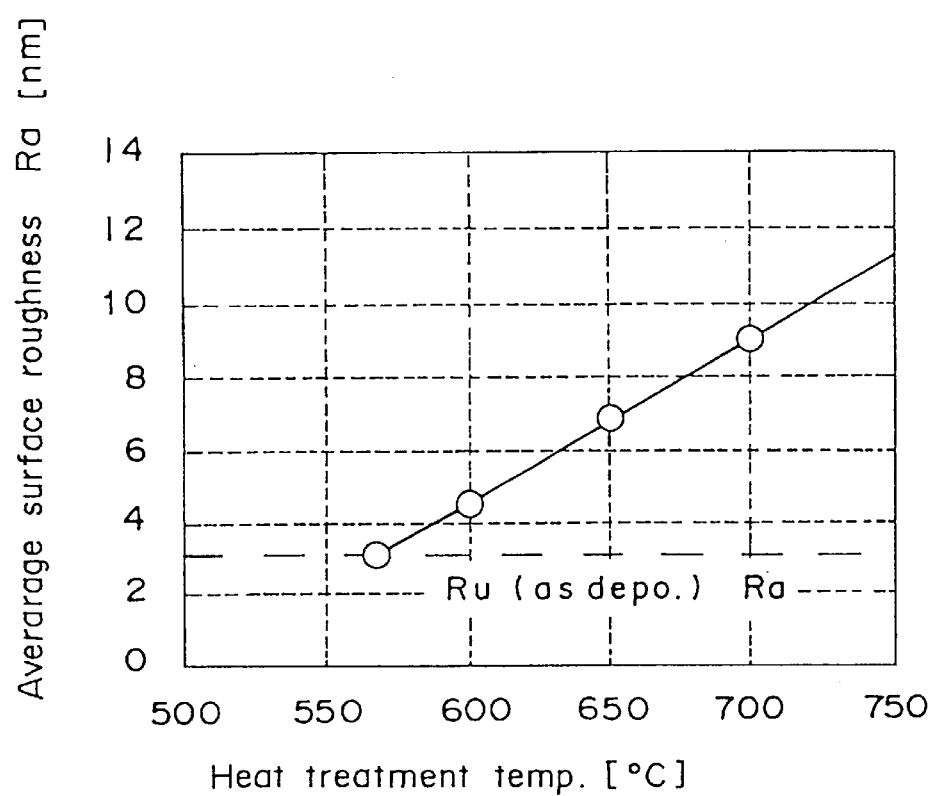
FIG. 19 is a graph showing the relationship between the heat-treatment temperature and the average surface roughness of the ruthenium thin-film electrode in the fifth embodiment of the present invention.
Figure 20:
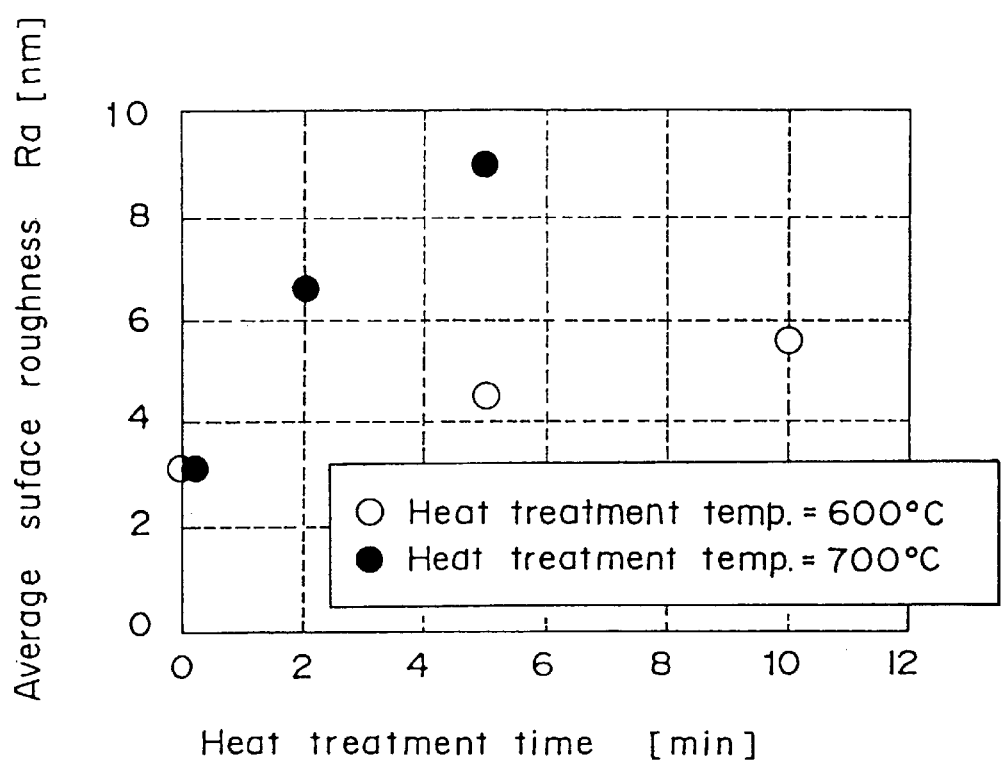
FIG. 20 is a graph showing the relationship between the hear-treatment time and the average surface roughness of the ruthenium thin film electrode in the fifth embodiment of the present invention.
Figure 21:
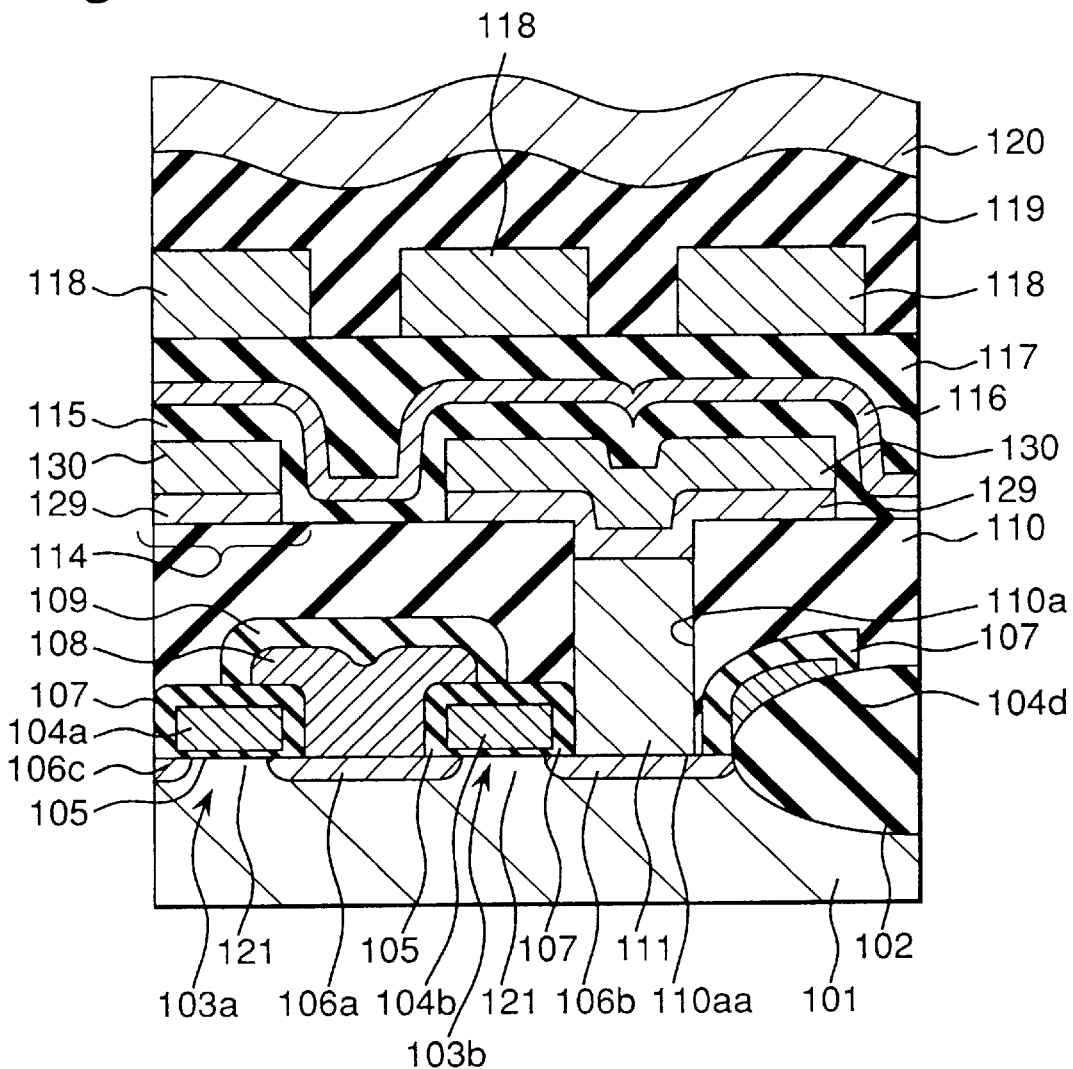
FIG. 21 is a partial sectional view of the prior art DRAM.

FIG. 19 shows the relationship between the heat treatment temperature and the average surface roughness of ruthenium that is exhibited when ruthenium is heat-treated for five minutes under the conditions of 5 m Torr in oxygen partial pressure. Also, FIG. 20 shows the relationship between the heat treatment time and the average surface roughness of the ruthenium that is exhibited when the ruthenium is heat-treated under the conditions of 5 m Torr in oxygen partial pressure at the substrate temperature of 600° C. and 700° C.

The results show that the average surface roughness of the ruthenium surface does not increase and the ruthenium metallic surface is not oxidized when the heat treatment is carried out at 650° C. to 750° C. with 10 m Torr or lower in oxygen partial pressure.

If no such heat treatment is carried out, the $BaTiO_3$ forming the capacitor dielectric film 115 exhibits a low crystallizability with its relative dielectric constant being about 20. However, the use of the heat treatment has resulted in improvement of crystallizability of the $BaTiO_3$ accompanied by increase of the relative dielectric constant to a value about five times that exhibited when no heat treatment was effected.

It is to be noted that film forming and heat treatment of the capacitor dielectric film 115 may be repeated cyclically, i.e., film forming→heat treatment→film forming→heat treatment, and by do doing, both of the crystallizability of and the relative dielectric constant of the capacitor dielectric film 115 can further be improved.

Then, the ruthenium film is formed on the capacitor dielectric film 115 to complete the upper capacitor electrode 116. The film thickness of the upper capacitor electrode 116 is preferably within the range of 30 to 600 nm and, however, in the illustrated embodiment, 100 nm is chosen for the film thickness of the upper capacitor electrode 116.

Thereafter, using the subsequent manufacturing steps similar to those hitherto employed in the art, the DRAM is completed.

Electric characteristics of the capacitor formed as described above have been evaluated. Where the heat treatment conducted to improve the crystallizability of the capacitor dielectric film 115 formed on the ruthenium lower capacitor electrode 130 was conducted with no oxygen partial pressure controlled, the capacitor leak current increased by 1 $\mu A/cm^2$ or more because of deformation in shape of the electrode which resulted from oxidization taking place on the surface of the lower capacitor electrode 13 heat-treated at 500 to 550° C. in substrate temperature. In contrast thereto, where in accordance with the embodiment of the present invention the heat treatment was conducted with the substrate temperature and the oxygen partial pressure controlled to 650 to 750° C. and a pressure not higher than 10 mTorr, respectively, the capacitor leak current due to the deformation of the lower capacitor electrode 130 was only 0.1 $\mu A/cm^2$ or lower. Thus, the capacitor leak current is considerably improved, showing that the present invention is effective to fabricate a highly reliable and stable capacitor.

According to the present embodiment as described hereinabove, the heat treatment of the capacitor dielectric film can be effected without being accompanied by oxidation of the capacitor electrode surface to improve the crystallizability even when the ruthenium is used for the lower capacitor electrode. Thus, the dielectric constant of the capacitor dielectric film can be improved without accompanying any increase in the capacitor leak current so that the capacitor cell of high capacity can be obtained.

Although in the following description of each of fifth to eighth preferred embodiments of the present invention, the lower capacitor electrode 130 will be described as made of ruthenium, it should be understood that similar benefits can be obtained even where in place of ruthenium iridium is employed as material for the lower capacitor electrode 130. It should also be understood that even about the capacitor dielectric film 115, dielectric material such as $SrTiO_3$, (Ba, Sr) $TiO_3$, Pb (Zr, Ti) or the like can be equally employed other than BaTiO, having perovskite structure.

Figure 17B:
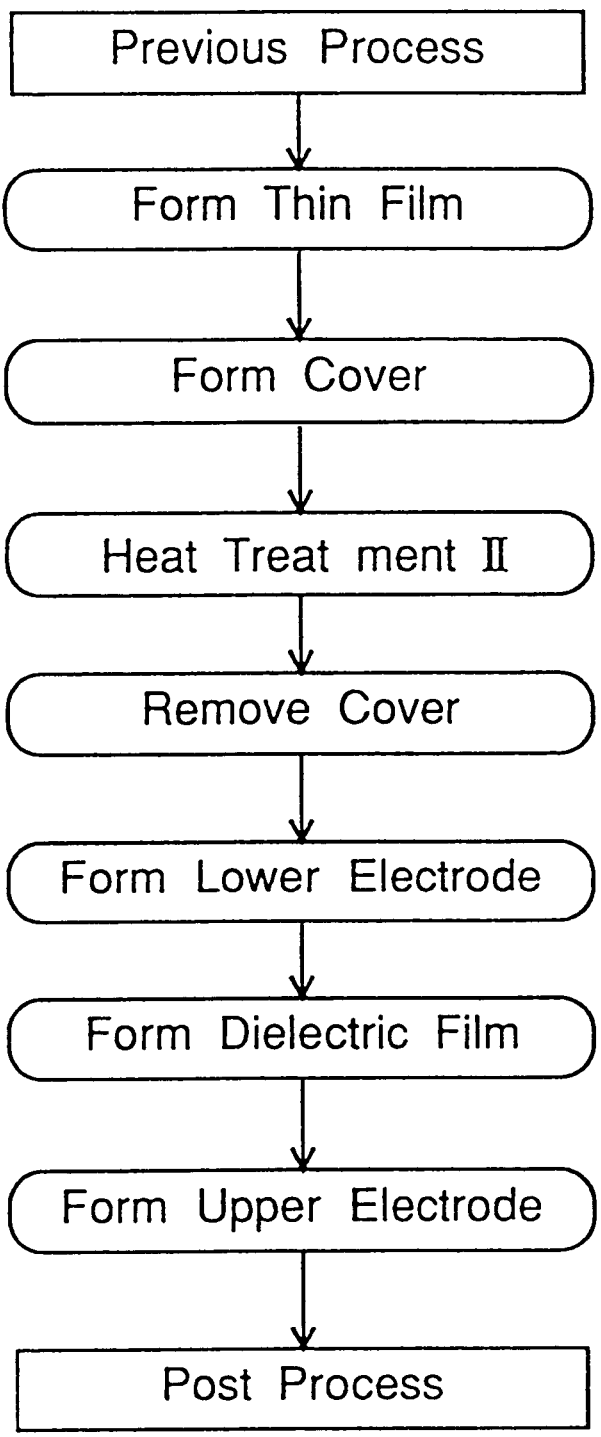
FIG. 17B is a process flow chart in the sixth embodiment of the present invention.

Embodiment 6—FIG. 17B

FIG. 17B illustrates the sequence of manufacturing steps practiced to make the DRAM according to a sixth embodiment of the present invention, which DRAM is shown in FIG. 16 in a partial sectional view.

In this embodiment, a ruthenium thin-film of 300 nm in thickness is used as the lower capacitor electrode 130. After formation of the ruthenium thin-film, a $SiO_2$ film of 100 nm in thickness made of tetraethoxy-orthosilicate (TEOS) as a raw material is formed by, for example, a thermal CVD method, as a cover layer 131 for retaining the flatness of the surface of the lower capacitor electrode 130 even during the subsequent heat treatment.

The heat treatment is effected at the substrate temperature of 800° C. 20 for 30 minutes. The temperature used during this heat treatment is a substrate temperature higher than the highest temperature which is attained during the subsequent process steps and is, in the illustrated embodiment, chosen to be 800° C. in consideration of the temperature used during a high temperature heat treatment (a self-align contact process) that is carried out to improve the plug contact between the wiring layer and the connecting member 111 subsequent to the formation of the capacitor cell. In this case, since the ruthenium thin-film is thermally treated in a condition covered with the cover layer 131, the flatness of the surface thereof is maintained even during the heat treatment so that no surface irregularity which would otherwise result from surface oxidization and/or surface roughening will occur.

Then, after the heat treatment, the cover layer 131 is removed by the dry etching method and the ruthenium thin-film is subsequently etched to form the lower capacitor electrode 130.

Thereafter, the $BaTiO_3$ film is formed on the lower capacitor electrode 130, under the conditions (500° C. in substrate temperature and 1 Torr in oxygen partial pressure) in which the surface of the lower capacitor electrode 130 will not be oxidized, with the use of CVD method after the formation of the lower capacitor electrode 130, to thereby form the capacitor dielectric film 115 on the lower capacitor electrode 130.

Then, the upper capacitor electrode 116 composed of ruthenium thin-film having a thickness preferably within the range of 30 to 600 nm, more preferably 100 nm, in thickness is formed on the capacitor dielectric film 115. Thereafter, a step similar to the step of the conventional method is used to complete the DRAM.

In the DRAM having the capacitor cell so formed in this manner, the high temperature heat treatment is normally performed to improve the plug contact for connecting between the wiring layers normally by the self-align contact step. The capacitor leak current increases five to ten times in the capacitor cell made by the conventional method when such high temperature heat treatment is performed. In contrast thereto, in the capacitor cell formed in accordance with the present embodiment, it is possible to control the leak current increase to approximately two times at maximum.

More specifically, according to the present embodiment, the cover layer 131 is formed to prevent the surface unevenness from occurring as a result of surface oxidation and the surface roughening which would occur during the heat treatment of the ruthenium thin-film which is a material for the lower capacitor electrode 130. After the formation of the cover layer 131, the temperature is raised to a value higher than the highest temperature to be used during the subsequent heat treatment step to give a thermal history so that even during the subsequent heat treatment, increase in capacitor leak current refuting from change in shape (mainly, surface shape) of the lower capacitor electrode by the surface oxidation or the like of the lower capacitor electrode 130 can be controlled to make it possible to provide the capacitor cell having favorable capacitor characteristics.

Figure 17C:
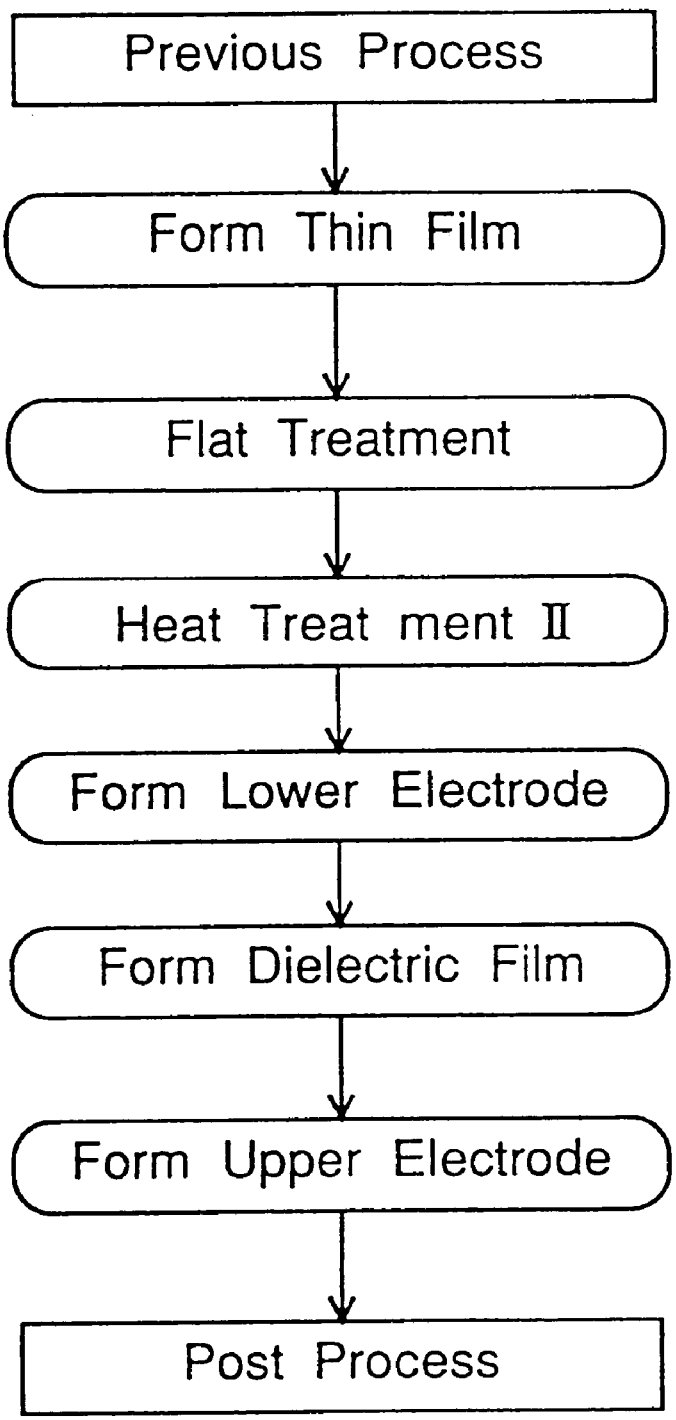
FIG. 17C is a process flow chart in the seventh embodiment of the present invention.

Embodiment 7—FIG. 17C

FIG. 17C illustrates the sequence of manufacturing steps practiced to make the DRAM according to a sixth embodiment of the present invention, which DRAM is shown in FIG. 16 in a partial sectional view.

In this seventh embodiment, a ruthenium thin-film of 300 nm in thickness is used as the lower capacitor electrode 130. After formation of the ruthenium thin-film, the heat treatment is effected at the substrate temperature of 800° C. for 30 minutes in consideration of the self-align contact process. The temperature used during this heat treatment may be any temperature if the latter is higher than the highest temperature which is attained during the subsequent process steps.

Since the ruthenium thin-film surface is susceptible to formation or projections during the heat treatment, the ruthenium thin-film surface is flattened by the use of a chemical mechanical polishing process which is used a SUBA 400 pad, weak acid $Al_2O_3$(0.1 μm) dispersion slurry and is effected for two minutes by the application of 80 kg/cm² in face pressure.

Thereafter, the ruthenium thin-film is etched to form the lower capacitor electrode 130. The capacitor dielectric film 115 made of $BaTiO_3$ film is subsequently formed with the use of the CVD method (500° C. in plate temperature and 1 Torr in oxygen partial pressure). In the instant embodiment, the upper capacitor electrode 116 in the form of the ruthenium thin-film having a film thickness within the range of 30 to 60 nm, more preferably 100 nm, is formed on the capacitor dielectric film 115. Thereafter, a step similar to the step of the conventional method is used to complete the DRAM.

Although the self-align contact step is normally performed even to the DRAM of the present embodiment, the capacitor leak current increases five to ten times in the capacitor cell made by the conventional method when such high temperature heat treatment is performed. In contrast thereto, in the capacitor cell formed in accordance with the present embodiment, it is possible to control the leak current increase to approximately two times at maximum.

More specifically, according to the present embodiment, the ruthenium thin-film which is material for the lower capacitor electrode 130 is given a thermal history by increasing the temperature used during the heat treatment to a value higher than the highest possible temperature, and the ruthenium thin-film is subsequently flattened by the use of the chemical mechanical polishing method effected to the surface thereof to thereby remove surface roughness and a surface oxide layer to thereby complete the lower capacitor electrode 130. By so doing, increase in capacitor leak current resulting from change in shape (mainly, surface shape) of the lower capacitor electrode by the surface oxidation or the like of the lower capacitor electrode 130 can be controlled to make it possible to provide the capacitor cell having favorable capacitor characteristics.

Figure 17D:
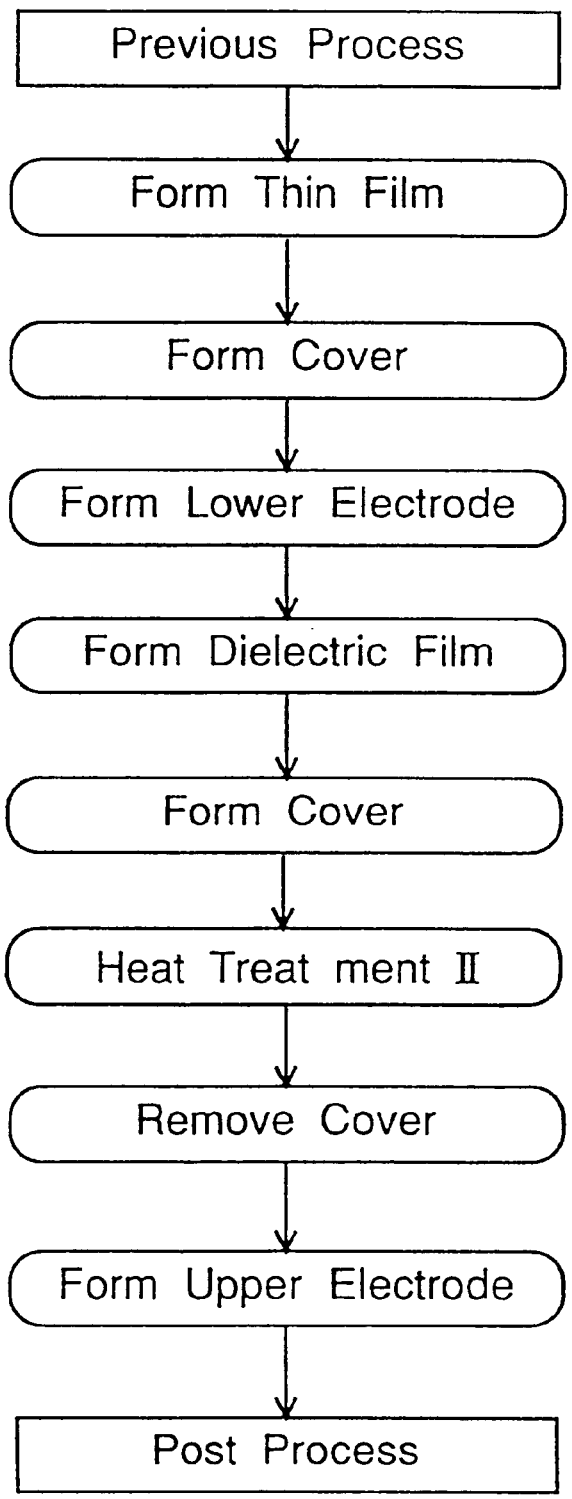
FIG. 17D is a process flow chart in the eighth embodiment of the present invention.

Embodiment 8—FIG. 17D

FIG. 17D illustrates the sequence of manufacturing steps practiced to make the DRAM according to a eighth embodiment of the present invention, which DRAM is shown in FIG. 16 in a partial sectional view.

In this eighth embodiment, the heat treatment referred to and described in connection with the sixth embodiment of the present invention with reference to FIG. 17B is carried out subsequent to the formation of the capacitor dielectric film 115 to bring about similar effects. Specifically, in the practice of the eighth embodiment, a ruthenium thin-film of 300 nm in thickness is used as the lower capacitor electrode 130. After formation of the ruthenium thin-film, the ruthenium thin-film is etched to form the lower capacitor electrode 130, followed by formation of the $BaTiO_3$ film to thereby form the capacitor dielectric film 115. Formation of the $BaTiO_3$ film is carried out by the CVD method effective to provide a good covering, under such a condition that no surface oxidization take place on the surface of the ruthenium thin-film.

After the formation of the capacitor dielectric film 115, the $SiO_2$ film of 100 nm in thickness is formed by the use of the thermal CVD method using the material such as tetraethoxy-orthosilicate (TEOS) as in the embodiment 6 as the cover layer 131. Then, the heat treatment at 800° C. for 30 minutes is performed in consideration of the self align contact step. The temperature used during this heat treatment may suffice to be of a value higher than the highest temperature experienced during the subsequent heat-treatment provided that it is carried out under a condition in which crystallization takes place sufficiently in the capacitor dielectric film 115. During such heat-treatment, the surface oxidation and the surface roughness of the lower capacitor electrode 130 are not caused because of the use of the cover layer 131.

Then, after the heat treatment, the cover layer 131 is removed by the dry etching method and the ruthenium thin-film is subsequently etched to form the lower capacitor electrode 130.

In the DRAM having the capacitor cell so formed in this manner, the self-align contact step is normally performed. The capacitor leak current increases five to ten times in the capacitor cell made by the conventional method when such high temperature heat treatment is performed. In contrast thereto, in the capacitor cell formed in accordance with the present embodiment, it is possible to control the leak current increase to approximately two times at maximum.

According to this embodiment, since the heat treatment discussed above concurrently serves as a heat treatment necessary to accomplish crystallization of the capacitor dielectric film 115, the crystallizability of the capacitor dielectric film 115 can be increased and, as compared with that not heat-treated, the relative dielectric constant can be increased ten times.

From the foregoing full description of the present invention, it has now become clear that the lower capacitor electrode is made of a material comprising ruthenium or iridium as a principal component element and containing oxygen in a quantity of 0.001 to 0.1% by atom and/or titanium or the like in a quantity of 0.1 to 5% by atom so that the electrode can be easily worked as compared with that made of platinum. It has also become clear that formation of an oxide at the upper end of the connecting member (plug) during the heat treatment is eliminated to avoid any possible deformation of the capacitor electrode which would otherwise result from formation of silicide as a result of reaction between ruthenium and Si contained in the connecting member, which has long been recognized as a problem when ruthenium is employed for the electrode, to thereby minimize increase of the capacitor leak current.

Also, according to the present invention, the interlayer separation between the capacitor electrode and the interlayer insulating film is prevented by the provision of the bond layer between the capacitor electrode and the interlayer insulating film, resulting in improvement in manufacturing yield. Especially, if the film thickness of the bond layer is chosen to be 50 nm or smaller, the deformation of the capacitor electrode due to the stress between the bond layer and the capacitor electrode can be prevented and the deterioration of the capacitor characteristics can be prevented.

Also, according to the present invention, the concentration of the oxygen included in the ruthenium or the like can be controlled where the formation of the ruthenium thin-film or the like is conducted under the proper oxygen partial pressure. In addition, in the annealing step after the formation of the ruthenium thin-film or the like, it is controlled by the adjustment of the oxygen partial pressure in the annealing atmosphere so that the concentration including the oxygen in the thin-film can be adjusted after the formation of the ruthenium thin-film or the like.

Also, according to the present invention, the heat treatment of increasing the crystallizability of the capacitor dielectric film can be conduced without being accompanied by oxidation of the surface of the lower capacitor electrode even when ruthenium or iridium thin-film is used in the lower capacitor electrode. Thus, the deformation of the electrode shape by the surface oxidation or the like of the lower capacitor electrode can be prevented, the dielectric constant of the capacitor dielectric film can be improved while preventing the increase of the capacitor leak current so that the capacitor cell of high capacity can be obtained.

Furthermore, according to the present invention, when ruthenium or iridium thin-film is used for the lower capacitor electrode, the provision of the cover layer for preventing the surface oxidation and the surface roughening is effective to avoid any possible deformation of the capacitor electrode which would occur as a result of a surface oxidization of the lower capacitor electrode during the subsequent heat treatment, to thereby suppress any possible increase of the capacitor leak current. Accordingly, the capacitor cell exhibiting a favorable capacitor characteristic can be obtained.

Especially, the heat treatment concurrently serves as the heat treatment for improving the crystallizability of the capacitor dielectric film to improve the relative dielectric constant of the capacitor dielectric film so that the capacitor cell of the high capacity can be obtained.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor device comprising:

a semiconductor substrate having a major surface;

a first interlayer insulating film formed on said semiconductor substrate and having an opening defined therein which reaches the major surface of said semiconductor substrate;

a connecting member made of Si as a principal component and embedded in the opening of said first interlayer insulating film;

a lower capacitor electrode connected electrically with the major surface of said semiconductor substrate through said connecting member and made of a principal component selected from the group consisting of ruthenium and iridium, said lower capacitor electrode containing at least one of oxygen in a quantity of 0.001 to 0.1% by atom and at least one impurity element in a quantity of 0.1 to 5% by atom, said impurity element being selected from the group consisting of titanium, chrome, tungsten, cobalt, palladium and molybdenum;

a capacitor dielectric film formed on said lower capacitor electrode;

an upper capacitor electrode formed on said capacitor dielectric film; and a second interlayer insulating film formed on said upper capacitor electrode.

2. The semiconductor device according to claim 1, further comprising:

a bond layer formed between said lower capacitor electrode and said first interlayer insulating film and/or between said upper capacitor electrode and said second interlayer insulating film.

3. The semiconductor device according to claim 2, wherein said bond layer is formed of a material selected from the group consisting of nitride titanium film, non-crystalline silicon film, and a laminated structure of nitride titanium film and non-crystalline silicon film, and has a film thickness not greater than 50 nm.

4. The semiconductor device according to claim 1, wherein said lower capacitor is made of ruthenium with an oxygen content of 0.001 to 0.1% by atom.

5. The semiconductor device according to claim 1, wherein said lower capacitor is made of iridium with an oxygen content of 0.001 to 0.1% by atom.

6. The semiconductor device according to claim 1, wherein said lower capacitor contains an impurity of 0.1 to 5% by atom selected from the group consisting of titanium, chrome, tungsten, cobalt, palladium, and molybdenum.

* * * * *